US012316280B2

United States Patent
Imai

(10) Patent No.: US 12,316,280 B2
(45) Date of Patent: May 27, 2025

(54) POWER AMPLIFIER CIRCUIT, DOHERTY AMPLIFIER CIRCUIT, MULTISTAGE AMPLIFIER CIRCUIT, AND POWER AMPLIFIER APPARATUS

(71) Applicant: Murata Manufacturing Co., Ltd., Kyoto (JP)

(72) Inventor: Shohei Imai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 527 days.

(21) Appl. No.: 17/813,124

(22) Filed: Jul. 18, 2022

(65) Prior Publication Data
US 2023/0013880 A1    Jan. 19, 2023

(30) Foreign Application Priority Data

Jul. 19, 2021  (JP) .................. 2021-119057

(51) Int. Cl.
  *H03F 1/02* (2006.01)
  *H03F 3/21* (2006.01)
(52) U.S. Cl.
  CPC ........... *H03F 1/0288* (2013.01); *H03F 3/211* (2013.01)
(58) Field of Classification Search
  CPC ............................. H03F 1/0288; H03F 3/211
  See application file for complete search history.

(56) References Cited

U.S. PATENT DOCUMENTS

| 4,545,076 A * | 10/1985 | Biard .................. H04B 10/693 257/E27.047 |
| 4,973,917 A * | 11/1990 | Johnson ................ H03F 3/26 330/254 |
| 11,714,440 B2 * | 8/2023 | Oomori ................. G05F 1/59 327/108 |
| 2001/0009389 A1 * | 7/2001 | Kasuya ............... H03F 3/45085 330/255 |
| 2003/0214275 A1 * | 11/2003 | Biagi .................. G05F 1/575 323/280 |
| 2010/0164770 A1 * | 7/2010 | Wan ................... H03M 1/0607 330/251 |
| 2019/0348955 A1 * | 11/2019 | Day ...................... H03F 3/19 |

FOREIGN PATENT DOCUMENTS

JP    S52-130554 A    11/1977

* cited by examiner

*Primary Examiner* — Patricia T Nguyen
(74) *Attorney, Agent, or Firm* — McDonald Hopkins LLC

(57) ABSTRACT

A power amplifier circuit includes a first amplifier transistor, a first nonlinear element, and a current control circuit. The first amplifier transistor has a base or a gate into which a first signal is input, a collector or a drain from which a signal resulting from amplification of the first signal is output, and an emitter or a source that is grounded. The first nonlinear element is connected between the collector or the drain of the first amplifier transistor and the base or the gate of the first amplifier transistor. The current control circuit is connected between the ground and the base or the gate of the first amplifier transistor and controls current flowing through the first nonlinear element.

16 Claims, 13 Drawing Sheets

US 12,316,280 B2

POWER AMPLIFIER CIRCUIT, DOHERTY AMPLIFIER CIRCUIT, MULTISTAGE AMPLIFIER CIRCUIT, AND POWER AMPLIFIER APPARATUS

CROSS REFERENCE TO RELATED APPLICATION

This application claims priority from Japanese Patent Application No. 2021-119057 filed on Jul. 19, 2021. The content of this application is incorporated herein by reference in its entirety.

BACKGROUND ART

The present disclosure relates to a power amplifier circuit, a Doherty amplifier circuit, a multistage amplifier circuit, and a power amplifier apparatus.

A transistor circuit capable of adjusting gain is provided (for example, refer to Japanese Unexamined Patent Application Publication No. 52-130554).

In the transistor circuit described in Japanese Unexamined Patent Application Publication No. 52-130554, an input signal input into an input terminal is subjected to differential amplification in two transistors and the input signal subjected to the differential amplification is output from two output terminals. Since this transistor circuit includes multiple differential amplifiers and multiple constant voltage sources, the configuration of the circuit is complicated.

BRIEF SUMMARY

The present disclosure provides a power amplifier circuit, a Doherty amplifier circuit, a multistage amplifier circuit, and a power amplifier apparatus, which are capable of realizing adjustment of gain in amplification of an input signal with simple circuit configurations.

A power amplifier circuit according to one aspect of the present disclosure includes a first amplifier transistor that has a base or a gate into which a first signal is input, a collector or a drain from which a signal resulting from amplification of the first signal is output, and an emitter or a source that is grounded; a first nonlinear circuit element that is connected between the collector or the drain of the first amplifier transistor and the base or the gate of the first amplifier transistor; and a current control circuit that is connected between the ground and the base or gate of the first amplifier transistor and that controls current flowing through the first nonlinear circuit element.

According to the present disclosure, it is possible to provide a power amplifier circuit, a Doherty amplifier circuit, a multistage amplifier circuit, and a power amplifier apparatus, which are capable of realizing adjustment of gain in amplification of an input signal with simple circuit configurations.

DETAILED DESCRIPTION

Figure 1:
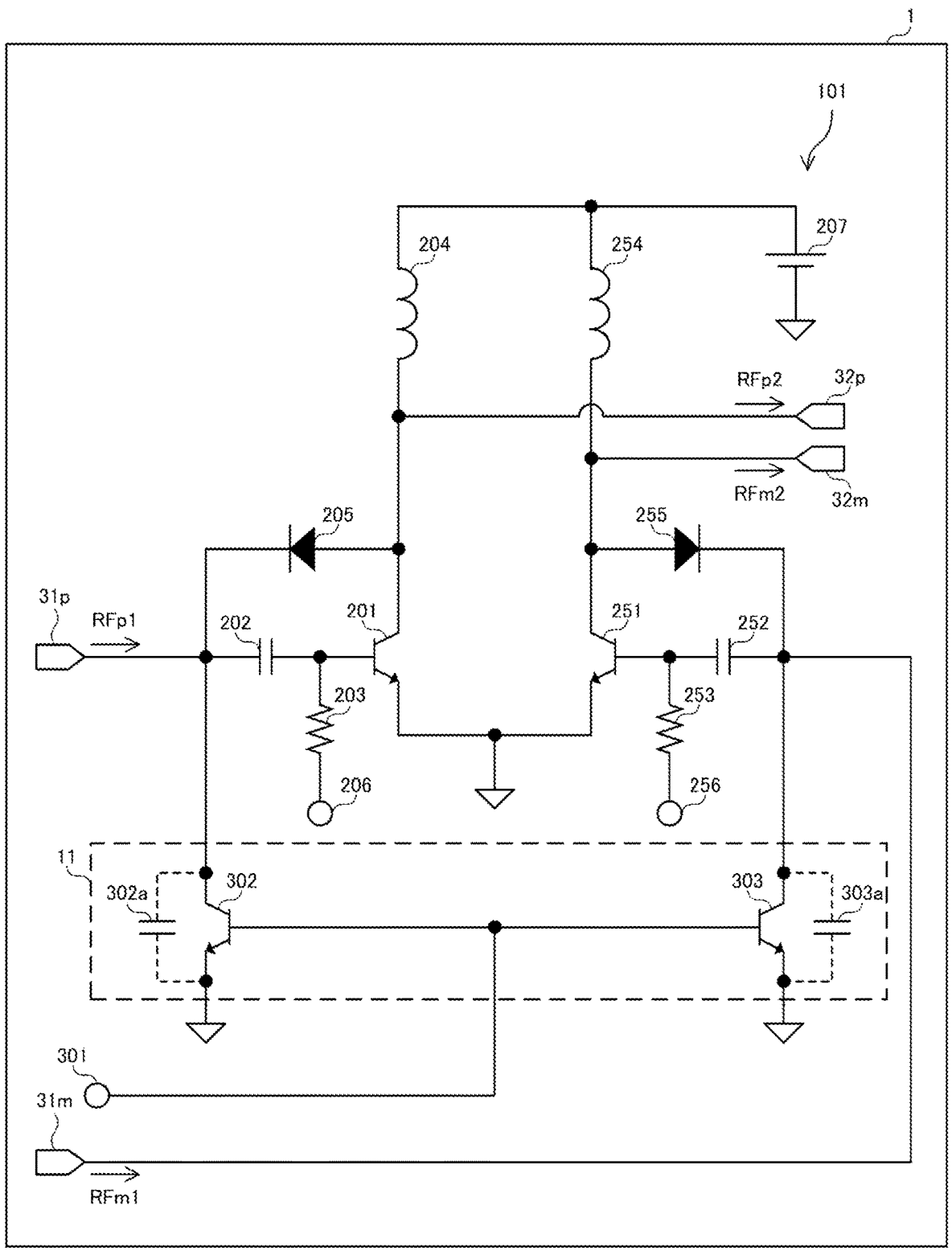
FIG. 1 is a circuit diagram of a power amplifier circuit according to a first embodiment of the present disclosure.

Embodiments of the present disclosure will herein be described in detail with reference to the drawings. The same reference numerals and letters are added to the same components and a duplicated description of such components is omitted herein.

First Embodiment

A power amplifier circuit according to a first embodiment will now be described. FIG. 1 is a circuit diagram of a power amplifier circuit 101. As illustrated in FIG. 1, a power amplifier apparatus includes compound semiconductor 1. The compound semiconductor 1 is manufactured in an integrated circuit process using semiconductor containing, for example, compound of a group III element and a group V element as a principal component. The semiconductor is, for example, semiconductor containing gallium arsenide (GaAs) as the principal component. The power amplifier circuit 101 is formed in and on the compound semiconductor 1.

The power amplifier circuit 101 amplifies balanced signals including a signal RFp1 (a first signal) and a signal RFm1 (a second signal) and outputs balanced signals including amplified signals RFp2 and RFm2. The power amplifier circuit 101 has variable gain. In other words, the power amplifier circuit 101 is a variable gain differential amplifier circuit.

The power amplifier circuit 101 includes a current control circuit 11, a first amplifier transistor 201, a second amplifier transistor 251, capacitors 202 and 252, resistive elements 203 and 253, inductors 204 and 254, a diode 205 (a first nonlinear circuit element and a first diode), a diode 255 (a second nonlinear circuit element and a second diode), and a voltage power supply 207.

In the first embodiment, the transistors including the first amplifier transistor 201 and the second amplifier transistor 251 are each composed of, for example, a bipolar transistor, such as a heterojunction bipolar transistor (HBT). The transistors including the first amplifier transistor 201 and the second amplifier transistor 251 may each be composed of another transistor, such as a metal oxide semiconductor-field effect transistor (MOSFET). In this case, a base, a collector, and an emitter are replaced with a gate, a drain, and a source, respectively.

The signals RFp1 and RFm1 are input into input terminals 31$p$ and 31$m$, respectively. In the first embodiment, the phase of the signal RFp1 is different from the phase of the signal RFm1 by approximately 180°. The phase difference may be greatly shifted from 180° depending on imbalance of the wiring length in the circuit or the like.

The capacitor 202 has a first end connected to the input terminal 31$p$ and a second end. The resistive element 203 has a first end connected to a bias supply terminal 206 and a second end. Bias current or bias voltage of the first amplifier transistor 201 is supplied to the bias supply terminal 206.

The first amplifier transistor 201 has a base connected to the second end of the capacitor 202 and the second end of the resistive element 203, a collector connected to an output terminal 32$p$, and an emitter that is grounded. The inductor 204 has a first end connected to the collector of the first amplifier transistor 201 and a second end connected to a positive electrode of the voltage power supply 207. A negative electrode of the voltage power supply 207 is grounded.

The bias current or the bias voltage is supplied from the bias supply terminal 206 to the base of the first amplifier transistor 201 through the resistive element 203. Voltage is applied from the voltage power supply 207 to the collector of the first amplifier transistor 201 through the inductor 204. The first amplifier transistor 201 amplifies the signal RFp1 input into the base and supplies the amplified signal RFp2 resulting from amplification of the signal RFp1 from the collector to the output terminal 32$p$.

The diode 205 has an anode connected to the collector of the first amplifier transistor 201 and a cathode connected to the first end of the capacitor 202. The diode 205 may be formed of a transistor having a collector connected to the collector of the first amplifier transistor 201, a base connected to the collector of the diode 205, and an emitter connected to the first end of the capacitor 202. Connection between the collector of a transistor and the base of the transistor may be hereinafter referred to as diode connection.

The capacitor 252 has a first end connected to the input terminal 31$m$ and a second end. The resistive element 253 has a first end connected to a bias supply terminal 256 and a second end. Bias current or bias voltage of the second amplifier transistor 251 is supplied to the bias supply terminal 256.

The second amplifier transistor 251 has a base connected to the second end of the capacitor 252 and the second end of the resistive element 253, a collector connected to an output terminal 32$m$, and an emitter that is grounded. The inductor 254 has a first end connected to the collector of the second amplifier transistor 251 and a second end connected to the positive electrode of the voltage power supply 207.

The bias current or the bias voltage is supplied from the bias supply terminal 256 to the base of the second amplifier transistor 251 through the resistive element 253. Voltage is applied from the voltage power supply 207 to the collector of the second amplifier transistor 251 through the inductor 254. The second amplifier transistor 251 amplifies the signal RFm1 input into the base and supplies the amplified signal RFm2 resulting from amplification of the signal RFm1 from the collector to the output terminal 32$m$.

The diode 255 has an anode connected to the collector of the second amplifier transistor 251 and a cathode connected to the first end of the capacitor 252. The diode 255 may be formed of a transistor that is diode-connected.

The current control circuit 11 is connected between the ground, and the base of the first amplifier transistor 201 and the base of the second amplifier transistor 251 and controls current flowing through the diode 205 and current flowing through the diode 255.

In the first embodiment, the current control circuit 11 includes a transistor 302 (a fourth transistor) and a transistor 303 (a fifth transistor). The transistor 302 has a collector connected to the cathode of the diode 205, the input terminal 31$p$, and the first end of the capacitor 202, a base connected to a variable gain amplifier (VGA) control signal input terminal 301, and an emitter that is grounded. A control signal for controlling the current flowing through the diode 205 and the current flowing through the diode 255 is supplied to the VGA control signal input terminal 301.

The transistor 303 has a collector connected to the cathode of the diode 255, the input terminal 31$m$, and the first end of the capacitor 252, a base connected to the base of the transistor 302 and the VGA control signal input terminal 301, and an emitter that is grounded.

Parasitic capacitance 302$a$ exits between the collector of the transistor 302 and the emitter thereof. Similarly, parasitic capacitance 303$a$ exists between the collector of the transistor 303 and the emitter thereof. The parasitic capacitance 302$a$ and the parasitic capacitance 303$a$ will be described in detail below.

(Amplification Operation of the Power Amplifier Circuit 101)

The first amplifier transistor 201 in the power amplifier circuit 101 operates as a collector-output emitter-grounded circuit. Accordingly, the first amplifier transistor 201 supplies the amplified signal RFp2 resulting from inverting amplification of the signal RFp1 to the output terminal 32$p$.

The provision of the diode 205 between the collector of the first amplifier transistor 201 and the base thereof forms a return path from the collector of the first amplifier transistor 201 to the base thereof. Accordingly, the amplified signal RFp2 output from the collector of the first amplifier transistor 201 is returned to the base of the first amplifier transistor 201 through the diode 205.

Since the voltage of the signal RFp1 has polarity reverse to that of the voltage of the amplified signal RFp2, the amplified signal RFp2 returned to the base of the first amplifier transistor 201 weakens the power of the signal RFp1. In other words, it is possible to reduce the gain of the first amplifier transistor 201 by feedback of the amplified signal RFp2 from the collector of the first amplifier transistor 201 to the base thereof.

The diode 205 has a property in which its equivalent resistance value is varied due to the current flowing through the diode 205. In the power amplifier circuit 101, the collector current of the transistor 302 is adjusted using the control signal supplied to the base of the transistor 302 through the VGA control signal input terminal 301. Increasing or decreasing the collector current of the transistor 302 enables the current flowing through the diode 205 to be increased or decreased.

In other words, since the adjustment of the current flowing through the diode 205 using the control signal enables the equivalent resistance value of the diode 205 to be adjusted, the amount of feedback of the amplified signal RFp2 from the collector of the first amplifier transistor 201 to the base thereof is capable of being adjusted. Accordingly, it is possible to adjust the gain of the first amplifier transistor 201.

As at the second amplifier transistor 251 side, since the adjustment of the current flowing through the diode 255 using the control signal enables the equivalent resistance value of the diode 255 to be adjusted, the amount of feedback of the amplified signal RFm2 from the collector of the second amplifier transistor 251 to the base thereof is capable of being adjusted. Accordingly, it is possible to adjust the gain of the second amplifier transistor 251.

Second Embodiment

A power amplifier circuit 102 according to a second embodiment will now be described. In the second embodiment and the subsequent embodiments, a description of matters common to the first embodiment is omitted and only points different from the first embodiment are described. In particular, the same effects and advantages of the same components are not redundantly described in the respective embodiments.

Figure 2:
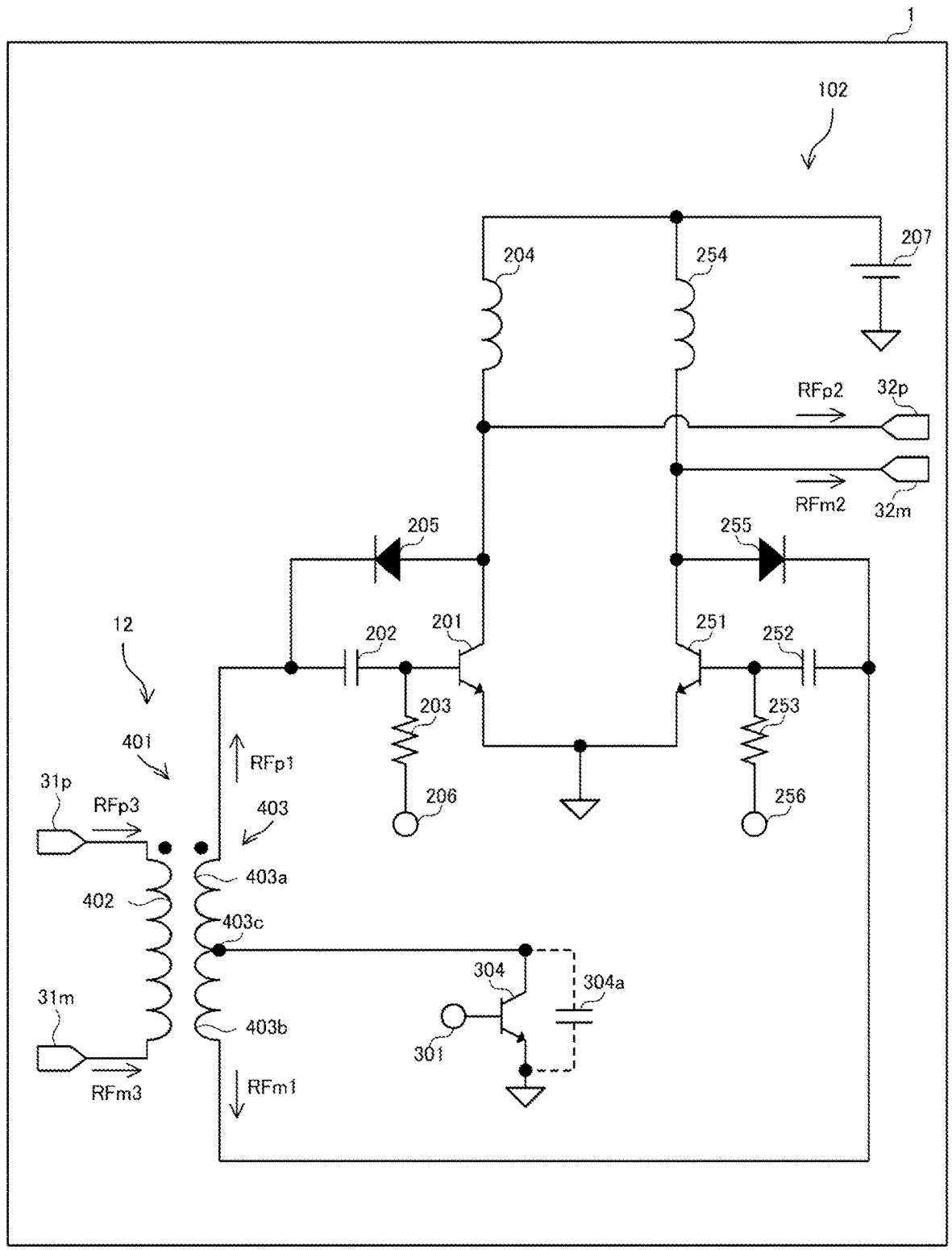
FIG. 2 is a circuit diagram of a power amplifier circuit according to a second embodiment of the present disclosure.

FIG. 2 is a circuit diagram of the power amplifier circuit 102. As illustrated in FIG. 2, the power amplifier circuit 102 according to the second embodiment differs from the power amplifier circuit 101 according to the first embodiment in that the collector of a transistor 304 in a current control circuit 12 is connected to the first amplifier transistor 201 and the second amplifier transistor 251 via inductors.

The power amplifier circuit 102 includes the current control circuit 12, instead of the current control circuit 11 in the power amplifier circuit 101 illustrated in FIG. 1. The current control circuit 12 includes the transistor 304 (a third transistor) and a transformer 401. The transformer 401 includes a primary-side inductor 402 (a first line) and a secondary-side inductor 403. The secondary-side inductor 403 includes an inductor 403a (a second line) and an inductor 403b (a third line).

In the second embodiment, a signal RFp3 (a third signal) and a signal RFm3 (a fourth signal) are supplied to the input terminals 31p and 31m, respectively. The phase of the signal RFp3 is shifted from the phase of the signal RFm3 by approximately 180°. In other words, the signal RFp3 is balanced with the signal RFm3. The phase difference may be greatly shifted from 180° depending on imbalance of the wiring length in the circuit or the like.

The primary-side inductor 402 has a first end connected to the input terminal 31p and a second end connected to the input terminal 31m.

The inductor 403a of the secondary-side inductor 403 is electromagnetically coupled to the primary-side inductor 402 and has a first end connected to the first end of the capacitor 202 and a second end, which is a node 403c.

The inductor 403b is electromagnetically coupled to the primary-side inductor 402 and has a first end connected to the second end of the inductor 403a, which is the node 403c, and a second end connected to the first end of the capacitor 252. The inductor 403b has approximately the same inductance as the inductance of the inductor 403a.

The transistor 304 has a collector connected to the node 403c, a base connected to the VGA control signal input terminal 301, and an emitter that is grounded. Parasitic capacitance 304a exists between the collector of the transistor 304 and the emitter thereof.
(Amplification Operation and Effects and Advantages of the Power Amplifier Circuit 102)

In the transformer 401, upon input of the signal RFp3 into the first end of the primary-side inductor 402 and input of the signal RFm3 into the second end thereof, the signal RFp1 is output from the first end of the inductor 403a and the signal RFm1 is output from the second end of the inductor 403b. The phase of the signal RFp1 is different from the phase of the signal RFm1 by approximately 180°.

The signal RFp1 is amplified by the first amplifier transistor 201. The amplified signal RFp2 resulting from the amplification of the signal RFp1 is output from the output terminal 32p. The signal RFm1 is amplified by the second amplifier transistor 251. The amplified signal RFm2 resulting from amplification of the signal RFm1 is output from the output terminal 32m.

In the power amplifier circuit 101 illustrated in FIG. 1, the collector of the transistor 302 and the collector of the transistor 303 are directly connected to the input terminals 31p and 31m, respectively. For example, when the signal RFp1 flows through the parasitic capacitance 302a of the transistor 302, reflected waves of the signal RFp1 may occur in the parasitic capacitance 302a. Similarly, when the signal RFm1 flows through the parasitic capacitance 303a of the transistor 303, reflected waves of the signal RFm1 may occur in the parasitic capacitance 303a. When the signals RFp1 and RFm1 are radio-frequency signals (RF signals), the power of such reflected waves is increased. The reflected waves are undesirable because the reflected waves reduce the quality of the signal or cause malfunction.

In addition, for example, when the signals RFp1 and RFm1 have large amplitudes, the potential at the base of the transistor 302 may be higher than the potential at the collector thereof. At this time, current flows from the base of the transistor 302 to the collector thereof to shift a bias point of the first amplifier transistor 201 or decrease the current flowing through the diode 205. Also in the transistor 303, current flows from the base of the transistor 303 to the collector thereof to shift the bias point of the second amplifier transistor 251 or decrease the current flowing through the diode 255.

In contrast, in the power amplifier circuit 102 illustrated in FIG. 2, since the collector of the transistor 304 is connected to the node 403c of the secondary-side inductor 403 from which no radio-frequency signal is output, an occurrence of the reflected waves is prevented in the parasitic capacitance 304a of the transistor 304. Accordingly, it is possible to prevent a reduction in the quality of the radio-frequency signal and an occurrence of malfunction.

In addition, it is possible to prevent the potential at the base of the transistor 304 from being higher than the potential at the collector thereof. This prevents the shift of the bias points of the first amplifier transistor 201 and the second amplifier transistor 251 and stabilizes the current flowing through the diodes 205 and 255. In other words, it is possible to realize the variable gain differential amplifier circuit that operates well for the radio-frequency signal.

Third Embodiment

Figure 3:
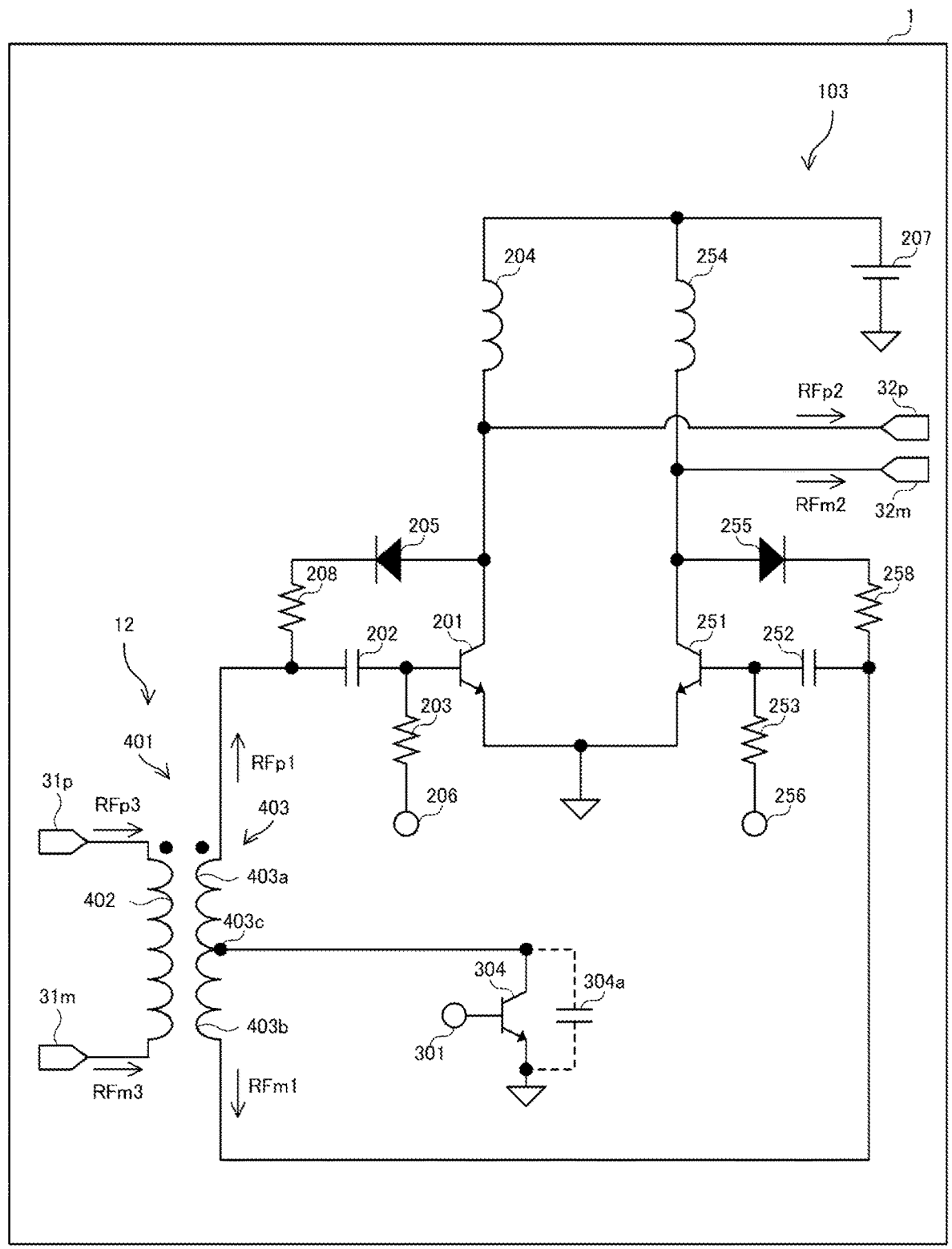
FIG. 3 is a circuit diagram of a power amplifier circuit according to a third embodiment of the present disclosure.

A power amplifier circuit 103 according to a third embodiment will now be described. FIG. 3 is a circuit diagram of the power amplifier circuit 103. As illustrated in FIG. 3, the power amplifier circuit 103 according to the third embodiment differs from the power amplifier circuit 102 according to the second embodiment in that a resistive element is connected in series to each of the diodes 205 and 255.

The power amplifier circuit 103 further includes a resistive element 208 (a first resistive element) and a resistive element 258, in addition to the components in the power amplifier circuit 102 illustrated in FIG. 2. The resistive element 208 has a first end connected to the first end of the capacitor 202 and the first end of the inductor 403a and a second end connected to the cathode of the diode 205. The resistive element 208 may have a configuration in which the first end is connected to the anode of the diode 205 and the second end is connected to the collector of the first amplifier transistor 201.

The resistive element 258 has a first end connected to the first end of the capacitor 252 and the second end of the inductor 403b and a second end connected to the cathode of the diode 255. The resistive element 258 may have a configuration in which the first end is connected to the anode of the diode 255 and the second end is connected to the collector of the second amplifier transistor 251.

With the above configuration, the lower limit of combined resistance value of the resistive element 208 and the diode 205 is capable of being adjusted using the resistance value of the resistive element 208. Accordingly, it is possible to adjust the lower limit of the gain of the first amplifier transistor 201.

Similarly, the lower limit of combined resistance value of the resistive element 258 and the diode 255 is capable of being adjusted using the resistance value of the resistive element 258. Accordingly, it is possible to adjust the lower limit of the gain of the second amplifier transistor 251.

The resistive element 208 may be connected in parallel to the diode 205. With this configuration, the upper limit of the combined resistance value of the resistive element 208 and the diode 205 is capable of being adjusted using the resistance value of the resistive element 208. Accordingly, it is possible to adjust the upper limit of the gain of the first amplifier transistor 201.

Similarly, the resistive element 258 may be connected in parallel to the diode 255. With this configuration, the upper limit of the combined resistance value of the resistive element 258 and the diode 255 is capable of being adjusted using the resistance value of the resistive element 258. Accordingly, it is possible to adjust the upper limit of the gain of the second amplifier transistor 251.

Fourth Embodiment

Figure 4:
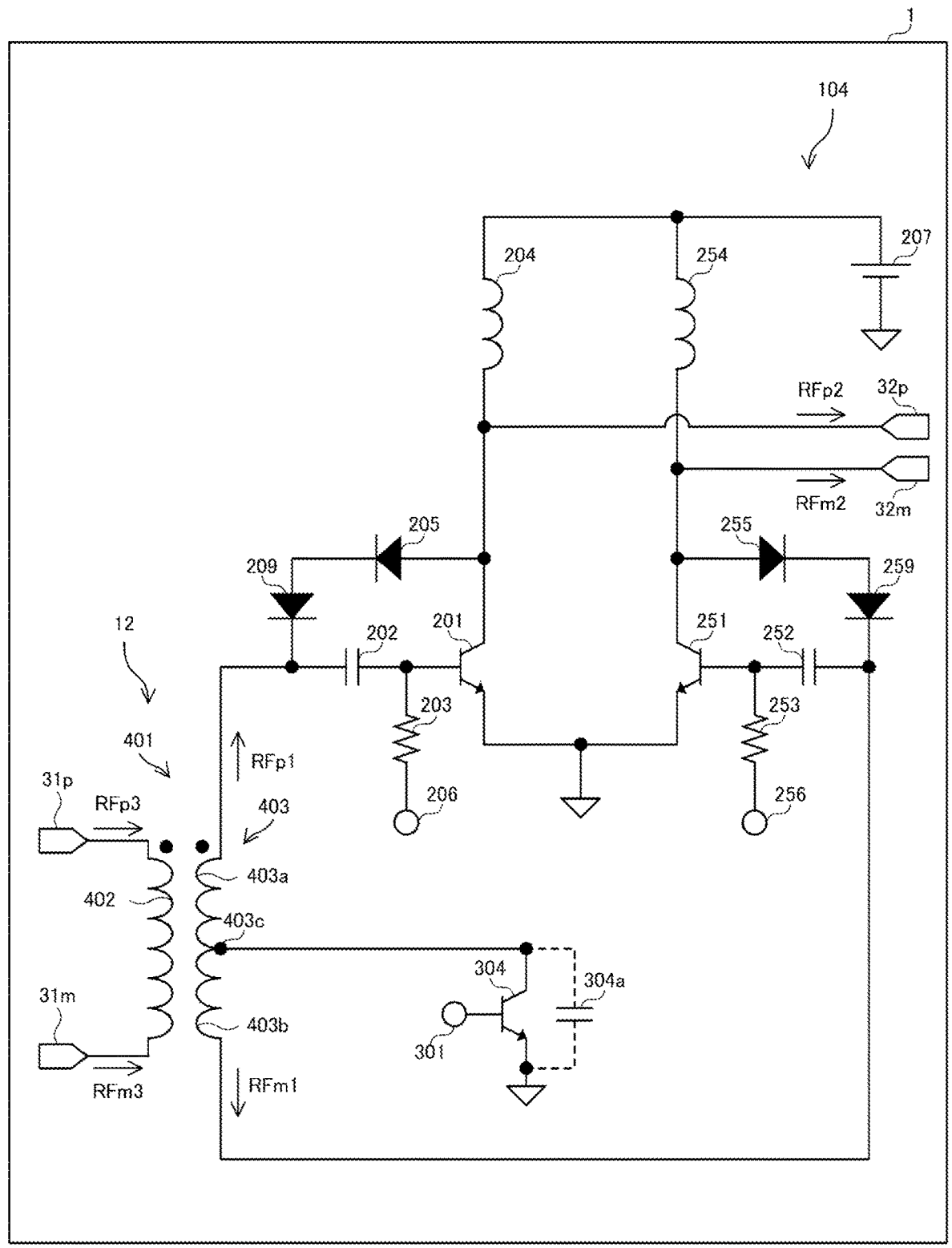
FIG. 4 is a circuit diagram of a power amplifier circuit according to a fourth embodiment of the present disclosure.

A power amplifier circuit 104 according to a fourth embodiment will now be described. FIG. 4 is a circuit diagram of the power amplifier circuit 104. As illustrated in FIG. 4, the power amplifier circuit 104 according to the fourth embodiment differs from the power amplifier circuit 102 according to the second embodiment in that another diode is connected in series to each of the diodes 205 and 255.

The power amplifier circuit 104 further includes a diode 209 (a second diode) and a diode 259, in addition to the components in the power amplifier circuit 102 illustrated in FIG. 2. The diode 209 has a cathode connected to the first end of the capacitor 202 and the first end of the inductor 403a and an anode connected to the cathode of the diode 205.

The diode 259 has a cathode connected to the first end of the capacitor 252 and the second end of the inductor 403b and an anode connected to the cathode of the diode 255. The diodes 209 and 259 may be formed of transistors that are diode-connected.

With the above configuration, a variable range of the combined resistance value of the diodes 205 and 209 is capable of being increased to approximately two times of the variable range of the equivalent resistance value of the diode 205 in the power amplifier circuit 102.

Similarly, the variable range of the combined resistance value of the diodes 255 and 259 is capable of being increased to approximately two times of the variable range of the equivalent resistance value of the diode 255 in the power amplifier circuit 102. Accordingly, it is possible to widen the adjustment ranges of the gain of the first amplifier transistor 201 and the gain of the second amplifier transistor 251, compared with those in the power amplifier circuit 102, and to increase the maximum gain.

Fifth Embodiment

Figure 5:
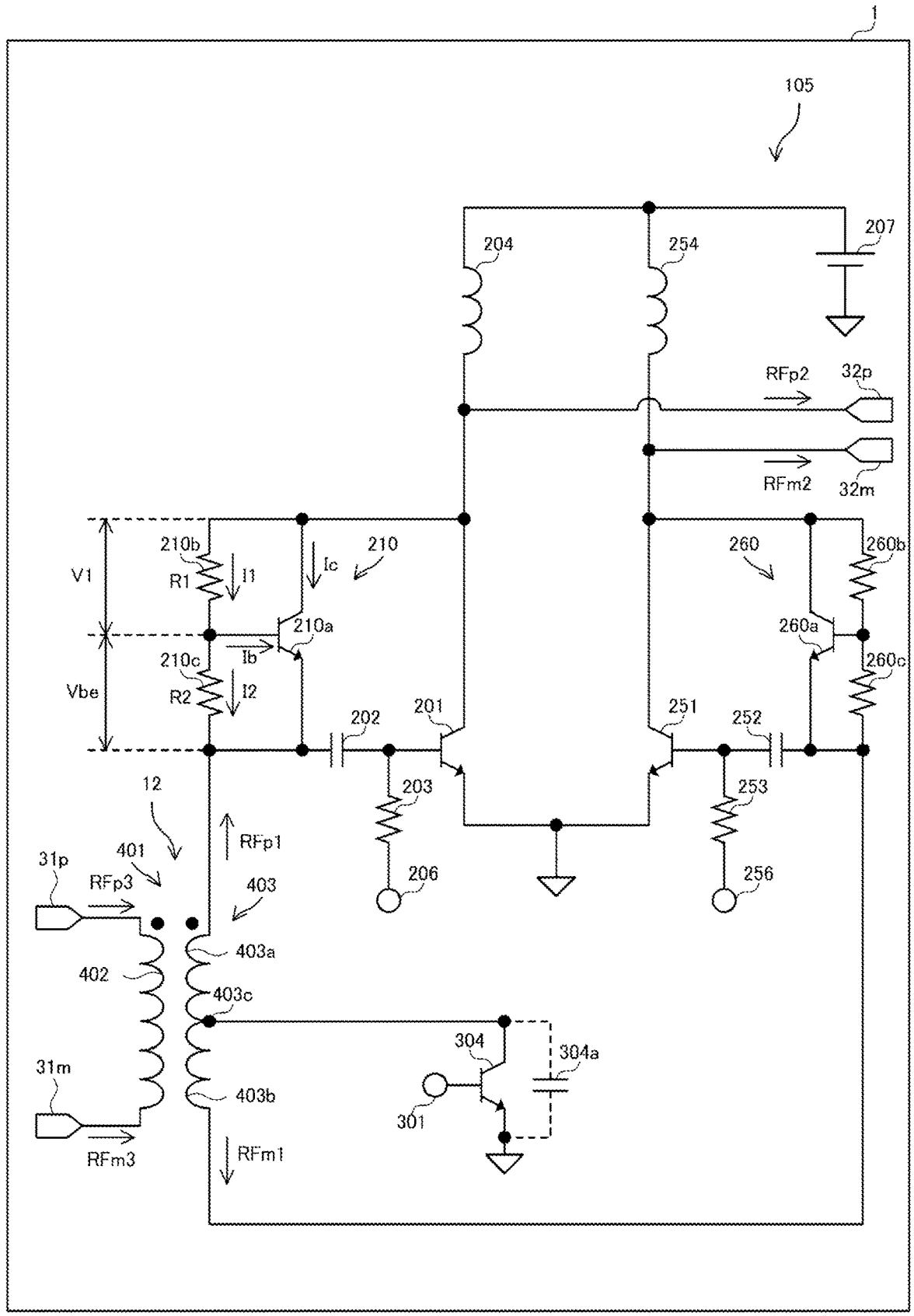
FIG. 5 is a circuit diagram of a power amplifier circuit according to a fifth embodiment of the present disclosure.

A power amplifier circuit 105 according to a fifth embodiment will now be described. FIG. 5 is a circuit diagram of the power amplifier circuit 105. As illustrated in FIG. 5, the power amplifier circuit 105 according to the fifth embodiment differs from the power amplifier circuit 102 according to the second embodiment in that voltage multiplier circuits are provided, instead of the diodes 205 and 255.

The power amplifier circuit 105 includes voltage multiplier circuits 210 and 260, instead of the diodes 205 and 255 in the power amplifier circuit 102 illustrated in FIG. 2.

The voltage multiplier circuit 210 includes a transistor 210a (the first nonlinear circuit element and a first transistor), a resistive element 210b (a second resistive element), and a resistive element 210c (a third resistive element). The voltage multiplier circuit 260 includes a transistor 260a (the second nonlinear circuit element and a second transistor), a resistive element 260b, and a resistive element 260c.

The transistor 210a has a collector connected to the collector of the first amplifier transistor 201, a base, and an emitter connected to the first end of the capacitor 202. The resistive element 210b has a first end connected to the collector of the transistor 210a and a second end connected to the base of the transistor 210a. The resistive element 210c has a first end connected to the base of the transistor 210a and a second end connected to the emitter of the transistor 210a.

The transistor 260a has a collector connected to the collector of the second amplifier transistor 251, a base, and an emitter connected to the first end of the capacitor 252. The resistive element 260b has a first end connected to the collector of the transistor 260a and a second end connected to the base of the transistor 260a. The resistive element 260c has a first end connected to the base of the transistor 260a and a second end connected to the emitter of the transistor 260a.

The operation of the voltage multiplier circuit will now be described. Since the voltage multiplier circuit 260 has a configuration similar to that of the voltage multiplier circuit 210, the voltage multiplier circuit 210 is typically described here and a description of the voltage multiplier circuit 260 is omitted herein.

For example, a state is considered in which collector current Ic of a level causing a conduction state flows through the transistor 210a. Since the transistor 210a is in the conduction state, base-emitter voltage Vbe of the transistor 210a is substantially constant (about 1.3 V in the case of GaAs-HBT).

Since the voltage between the first end and the second end of the resistive element 210c is equal to Vbe, current I2 flowing through the resistive element 210c is calculated by dividing Vbe by a resistance value R2 of the resistive element 210c, that is, Vbe/R2.

When the resistance value R2 is set to a low value so that base current Ib of the transistor 210a is decreased to an extent that is ignorable with respect to the current ($R2 \ll Vbe/Ib$), current I1 flowing through the resistive element 210b is considered to be equal to the current I2 (I1=I2).

Voltage V1 between the first end and the second end of the resistive element 210b is calculated by multiplying a resistance value R1 of the resistive element 210b by the current I1, that is, R1×I1. Since I1=I2 and I2=Vbe/R2, V1=R1×Vbe/R2.

Accordingly, the voltage between the collector and the emitter of the transistor 210a is calculated by adding the voltage between both ends of the resistive element 210b to the voltage between both ends of the resistive element 210c, that is, (Vbe+R1×Vbe/R2)=Vbe×(1+R1/R2).

Since the base-emitter voltage Vbe of the transistor 210a has a substantially constant value, the voltage between both ends of the voltage multiplier circuit 210 is substantially constant. Accordingly, adjusting the current flowing through the voltage multiplier circuit 210 with the transistor 304 enables the equivalent resistance value between both ends of the voltage multiplier circuit 210 to be adjusted. In other words, it is possible to adjust the gain of the first amplifier transistor 201.

In addition, since appropriately selecting the resistance value of the resistive element 210b and the resistance value of the resistive element 210c enables the voltage between both ends of the voltage multiplier circuit 210 to be arbitrarily set, the range of the equivalent resistance value between both ends of the voltage multiplier circuit 210 is capable of being adjusted. In other words, the range of the gain of the first amplifier transistor 201 is capable of being adjusted. Consequently, it is possible to improve the degree of freedom of design of the power amplifier circuit 105.

Sixth Embodiment

Figure 6:
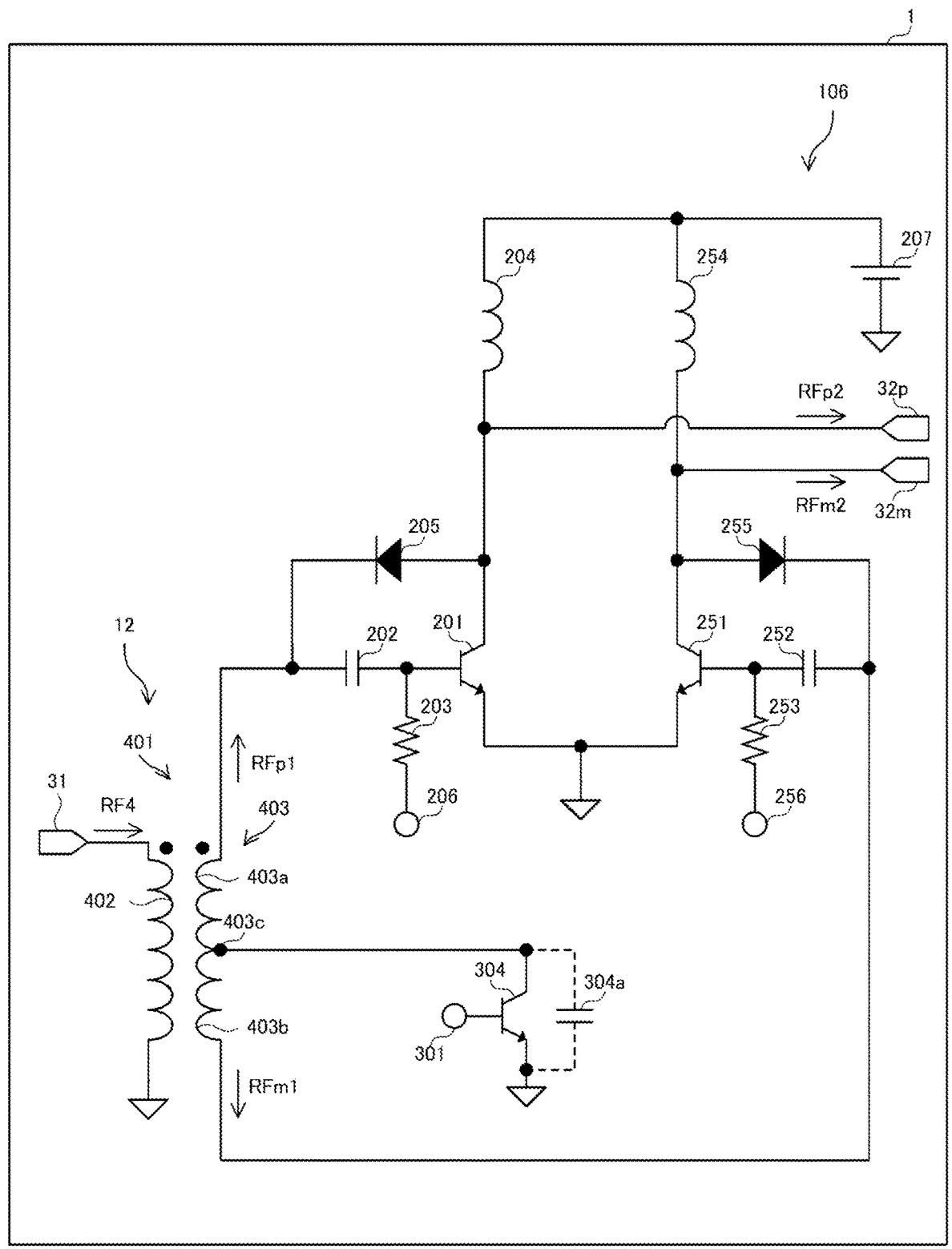
FIG. 6 is a circuit diagram of a power amplifier circuit according to a sixth embodiment of the present disclosure.

A power amplifier circuit 106 according to a sixth embodiment will now be described. FIG. 6 is a circuit diagram of the power amplifier circuit 106. As illustrated in FIG. 6, the power amplifier circuit 106 according to the sixth embodiment differs from the power amplifier circuit 102 according to the second embodiment in that a single-ended signal is input into the power amplifier circuit 106.

In the sixth embodiment, the transformer 401 functions as a balun. A signal RF4 (the third signal), which is the single-ended signal, is input into an input terminal 31. In the transformer 401, the first end of the primary-side inductor 402 is connected to the input terminal 31 and the second end thereof is grounded. Upon input of the signal RF4 into the first end of the primary-side inductor 402, the signal RFp1 is output from the first end of the inductor 403a and the signal RFm1 is output from the second end of the inductor 403b. The phase of the signal RFp1 is shifted from the phase of the signal RFm1 by approximately 180°.

With the above configuration, it is possible to realize the variable gain differential amplifier circuit that operates well for the single-ended signal in a high-frequency band.

Seventh Embodiment

Figure 7:
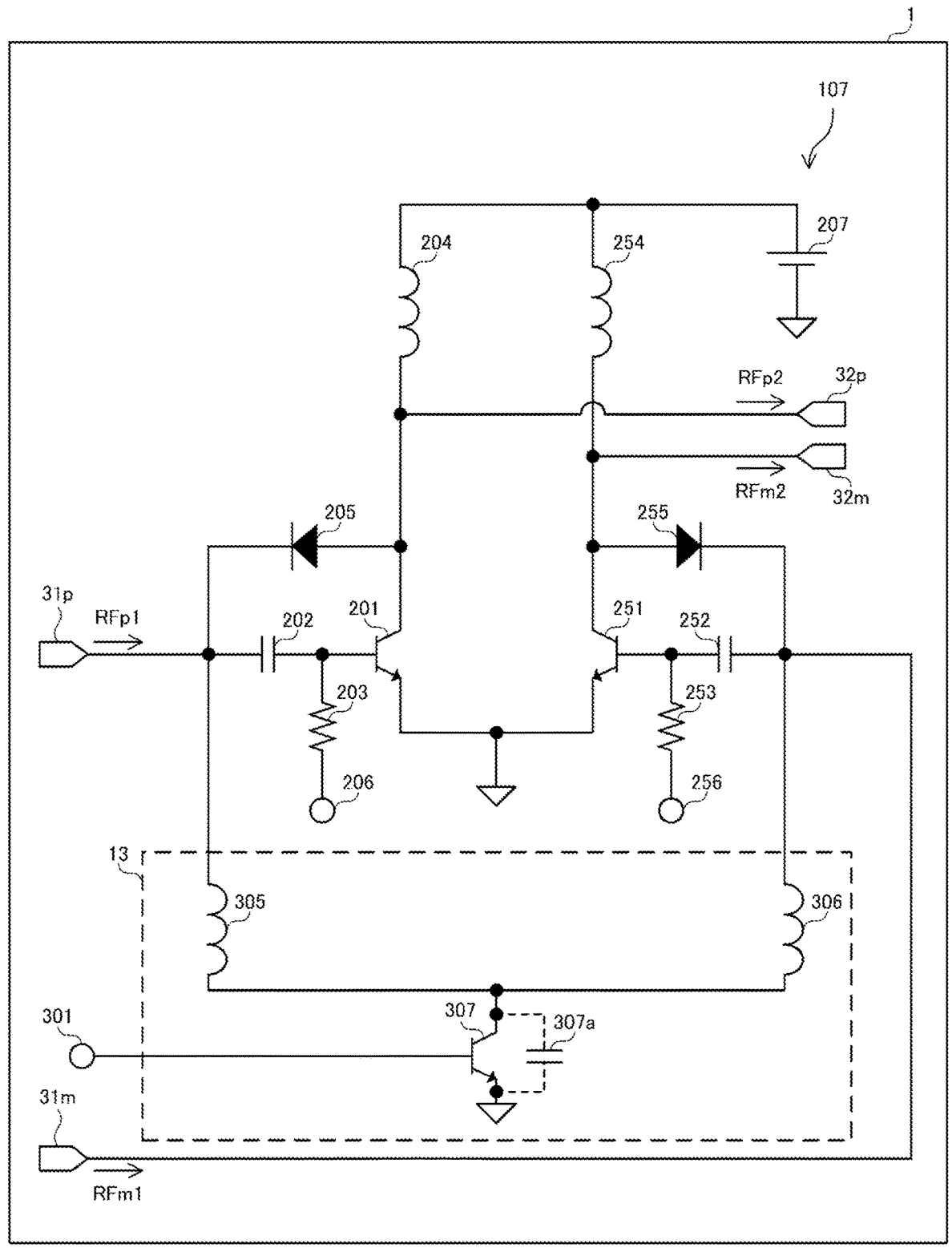
FIG. 7 is a circuit diagram of a power amplifier circuit according to a seventh embodiment of the present disclosure.

A power amplifier circuit 107 according to a seventh embodiment will now be described. FIG. 7 is a circuit diagram of the power amplifier circuit 107. As illustrated in FIG. 7, the power amplifier circuit 107 according to the seventh embodiment differs from the power amplifier circuit 101 according to the first embodiment in that a current control circuit 13 is realized by one transistor.

The power amplifier circuit 107 includes the current control circuit 13, instead of the current control circuit 11 in the power amplifier circuit 101 illustrated in FIG. 1. The current control circuit 13 includes an inductor 305 (a first impedance element), an inductor 306 (a second impedance element), and a transistor 307 (a sixth transistor). Parasitic capacitance 307a exists between the collector and the emitter of the transistor 307.

The inductor 305 has a first end connected to the cathode of the diode 205, the input terminal 31p, and the first end of the capacitor 202, and a second end. The inductor 306 has a first end connected to the cathode of the diode 255, the input terminal 31m, and the first end of the capacitor 252, and a second end.

The transistor 307 has a collector connected to the second end of the inductor 305 and the second end of the inductor 306, a base connected to the VGA control signal input terminal 301, and an emitter that is grounded.

As described above, with the configuration including the inductors 305 and 306 between the input terminals 31p and 31m, the current flowing through the diodes 205 and 255 is capable of being adjusted with one transistor 307 to adjust the equivalent resistance values of the diodes 205 and 255 while preventing short-circuiting of the input terminals 31p and 31m with an alternating current signal. Consequently, it is possible to adjust the gain of the first amplifier transistor 201 and the gain of the second amplifier transistor 251 with one transistor 307.

Although the power amplifier circuit 107 is described to have the configuration including the inductors 305 and 306 as the impedance elements, the configuration of the power amplifier circuit 107 is not limited to this. The power amplifier circuit 107 may have a configuration including two resistive elements, instead of the inductors 305 and 306.

Eighth Embodiment

Figure 8:
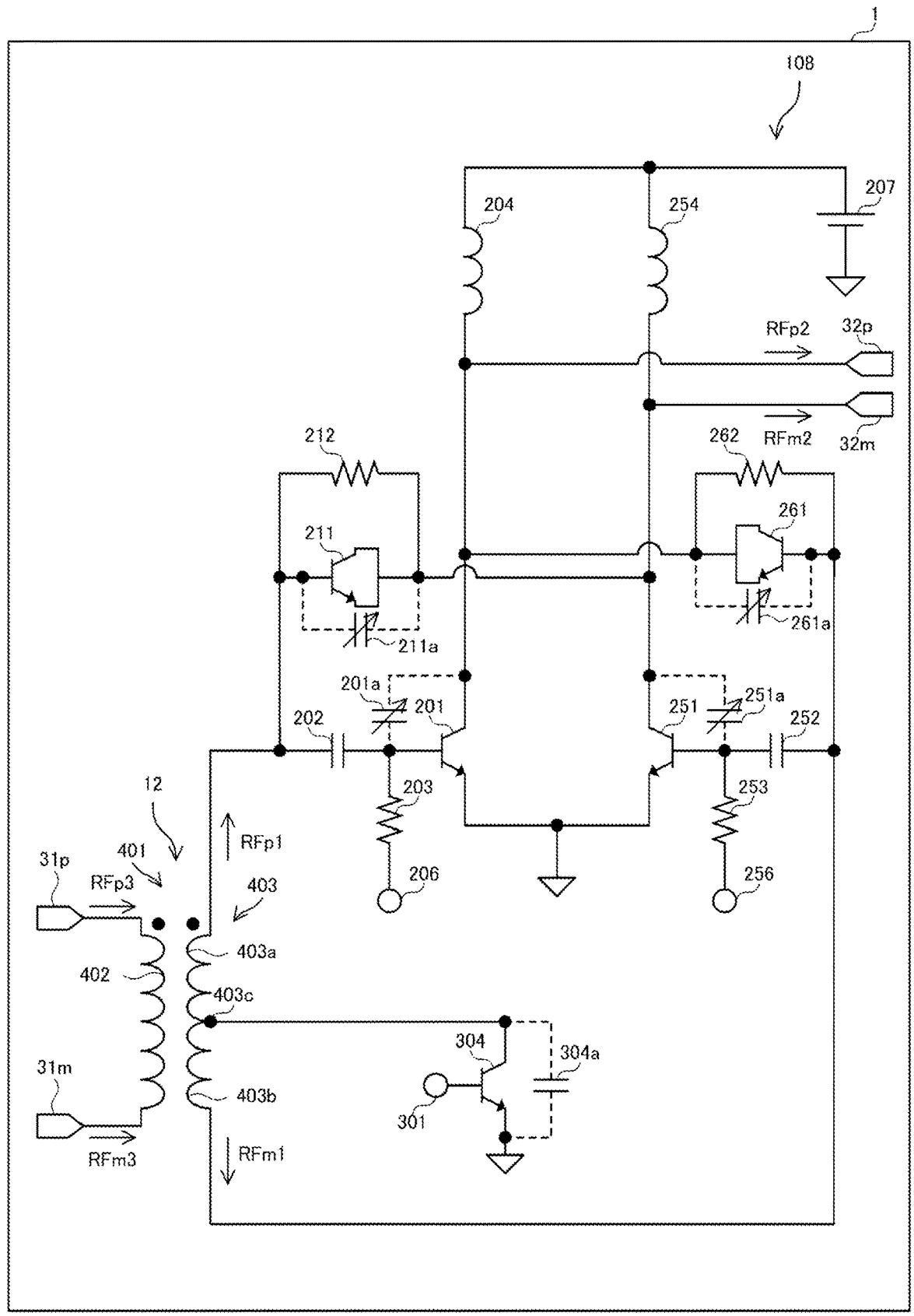
FIG. 8 is a circuit diagram of a power amplifier circuit according to an eighth embodiment of the present disclosure.

A power amplifier circuit 108 according to an eighth embodiment will now be described. FIG. 8 is a circuit diagram of the power amplifier circuit 108. As illustrated in FIG. 8, the power amplifier circuit 108 according to the eighth embodiment differs from the power amplifier circuit 102 according to the second embodiment in that cross coupling is adopted in which a nonlinear circuit element is provided between the collector of one amplifier transistor in a differential pair and the base of the other amplifier transistor therein.

The power amplifier circuit 108 includes a transistor 211 (the first nonlinear circuit element), a transistor 261 (the second nonlinear circuit element), and resistive elements 212 and 262, instead of the diodes 205 and 255 in the power amplifier circuit 102 illustrated in FIG. 2.

The transistor 211 has a collector connected to the collector of the second amplifier transistor 251, a base connected to the first end of the capacitor 202, and an emitter connected to the collector of the transistor 211.

The resistive element 212 has a first end connected to the base of the transistor 211 and a second end connected to the collector of the transistor 211.

The transistor 261 has a collector connected to the collector of the first amplifier transistor 201, a base connected to the first end of the capacitor 252, and an emitter connected to the collector of the transistor 261.

The resistive element 262 has a first end connected to the base of the transistor 261 and a second end connected to the collector of the transistor 261.

(Amplification Operation and Effects and Advantages of the Power Amplifier Circuit 108)

Since junction capacitance 201*a* is parasitized between the collector and the base of the first amplifier transistor 201, a return path from the collector of the first amplifier transistor 201 to the base thereof is formed. The junction capacitance 201*a* is decreased as the voltage between the collector and the base is increased and is increased as the voltage between the collector and the base is decreased.

The amplified signal RFp2 output from the collector of the first amplifier transistor 201 is returned to the base of the first amplifier transistor 201 via the junction capacitance 201*a*.

Reduction in the gain of the first amplifier transistor 201 and degradation of input dependency of pass phase characteristics undesirably occur due to the amplified signal RFp2 returned to the base of the first amplifier transistor 201.

As in the second amplifier transistor 251, reduction in the gain of the second amplifier transistor 251 and degradation of the input dependency of the pass phase characteristics occur due to junction capacitance 251*a* parasitized between the collector and the base of the second amplifier transistor 251.

In order to resolve the above problems, the power amplifier circuit 108 includes a path from the collector of the second amplifier transistor 251 to the base of the first amplifier transistor 201 through a parallel circuit of the transistor 211 and the resistive element 212 and the capacitor 202. Junction capacitance 211*a* is parasitized between the base, and the collector and the emitter of the transistor 211.

Adjusting the control signal to be supplied to the base of the transistor 304 enables the current flowing through the resistive element 212 to be varied. This adjusts reverse bias to be applied to the transistor 211 and adjusts the junction capacitance 211*a* between the collector and the base of the transistor 211.

The adjustment of the junction capacitance 211*a* enables the amplitude of the amplified signal RFm2 to be supplied from the collector of the second amplifier transistor 251 to the base of the first amplifier transistor 201 through the junction capacitance 211*a* and the capacitor 202 to be varied. The amplified signal RFm2 to be supplied to the base of the first amplifier transistor 201 through the junction capacitance 211*a* has a phase opposite to that of the amplified signal RFp2 to be supplied to the base of the first amplifier transistor 201 through the junction capacitance 201*a*. Accordingly, selecting the bias so that the amplified signal RFm2 has the same amplitude as that of the amplified signal RFp2 offsets the amplified signal RFm2 and the amplified signal RFp2 to weaken the influence of the junction capacitance 201*a*. In other words, weakening the influence of the junction capacitance 201*a*, which reduces the gain of the first amplifier transistor 201, causes most of the signal RFp1 from the inductor 403*a* in the transformer 401 to be supplied to the base of the first amplifier transistor 201 to increase the gain. Accordingly, it is possible to suppress the reduction in the gain of the first amplifier transistor 201 and the degradation of the input dependency of the pass phase characteristics.

Since differentiating the amplitude of the amplified signal RFm2 to be supplied to the base of the first amplifier transistor 201 through the junction capacitance 211*a* from the amplitude of the amplified signal RFp2 to be supplied to the base of the first amplifier transistor 201 through the junction capacitance 201*a* decreases the signal RFp1, which is supplied from the inductor 403*a* to the base of the first amplifier transistor 201, it is also possible to reduce the gain.

Similarly, the power amplifier circuit 108 includes a path from the collector of the first amplifier transistor 201 to the base of the second amplifier transistor 251 through a parallel circuit of the transistor 261 and the resistive element 262 and the capacitor 252. Junction capacitance 261*a* is parasitized between the base, and the collector and the emitter of the transistor 261.

Adjusting the control signal to be supplied to the base of the transistor 304 enables the current flowing through the resistive element 262 to be varied. This adjusts reverse bias to be applied to the transistor 261 and adjusts the junction capacitance 261*a* between the collector and the base of the transistor 261.

The adjustment of the junction capacitance 261*a* enables the amplitude of the amplified signal RFp2 to be supplied from the collector of the first amplifier transistor 201 to the base of the second amplifier transistor 251 through the junction capacitance 261*a* and the capacitor 252 to be varied. The amplified signal RFp2 to be supplied to the base of the second amplifier transistor 251 through the junction capacitance 261*a* has a phase opposite to that of the amplified signal RFm2 to be supplied to the base of the second amplifier transistor 251 through the junction capacitance 251*a*. Accordingly, selecting the bias so that the amplified signal RFp2 has the same amplitude as that of the amplified signal RFm2 offsets the amplified signal RFp2 and the amplified signal RFm2 to weaken the influence of the junction capacitance 251*a*. In other words, weakening the influence of the junction capacitance 251*a*, which reduces the gain of the second amplifier transistor 251, causes most of the signal RFm1 from the inductor 403*b* in the transformer 401 to be supplied to the base of the second amplifier transistor 251 to increase the gain. Accordingly, it is possible to suppress the reduction in the gain of the second amplifier transistor 251 and the degradation of the input dependency of the pass phase characteristics.

Since differentiating the amplitude of the amplified signal RFp2 to be supplied to the base of the second amplifier transistor 251 through the junction capacitance 261*a* from the amplitude of the amplified signal RFm2 to be supplied to the base of the second amplifier transistor 251 through the junction capacitance 251*a* decreases the signal RFm1, which is supplied from the inductor 403*b* to the base of the second amplifier transistor 251, it is also possible to reduce the gain.

Although the power amplifier circuit 108 is described to have the configuration including the current control circuit 12, the configuration of the power amplifier circuit 108 is not limited to this. The power amplifier circuit 108 may have a configuration including the current control circuit 11 or 13, instead of the current control circuit 12.

Although the power amplifier circuit 108 is described to have the configuration including the transistors 211 and 261, the configuration of the power amplifier circuit 108 is not limited to this. The power amplifier circuit 108 may have a configuration including diodes, instead of the transistors 211 and 261.

Ninth Embodiment

Figure 9:
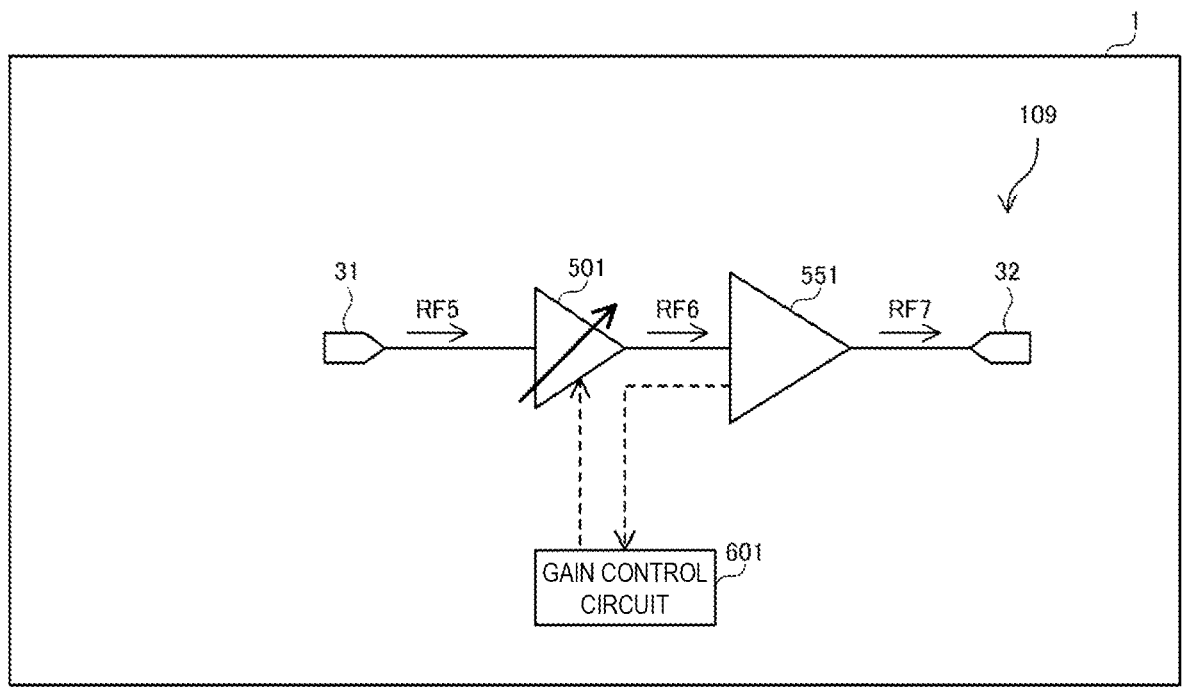
FIG. 9 is a circuit diagram of a multistage amplifier circuit according to a ninth embodiment of the present disclosure.

A multistage amplifier circuit 109 according to a ninth embodiment will now be described. FIG. 9 is a circuit diagram of the multistage amplifier circuit 109. As illustrated in FIG. 9, the multistage amplifier circuit 109 according to the ninth embodiment differs from the power amplifier circuit 102 according to the second embodiment in that a variable gain amplifier 501 amplifies a single-ended signal.

The multistage amplifier circuit 109 includes the variable gain amplifier 501 (the power amplifier circuit), a power-stage amplifier 551, and a gain control circuit 601.

The multistage amplifier circuit 109 is used for amplification of, for example, an RF signal. In the ninth embodiment, the variable gain amplifier 501 is a drive-stage amplifier. The variable gain amplifier 501 amplifies a signal RF5 (an input signal) input into the multistage amplifier circuit 109 through the input terminal 31 and supplies an amplified signal RF6 resulting from amplification of the signal RF5 to the power-stage amplifier 551.

The power-stage amplifier 551 amplifies the amplified signal RF6 amplified by the variable gain amplifier 501 and supplies an amplified signal RF7 resulting from amplification of the amplified signal RF6 to an output terminal 32.

The gain control circuit controls the gain of the amplifier to be controlled based on the degree of saturation in the amplifier to be detected. The "control of the gain of the amplifier to be controlled based on the degree of saturation in the amplifier to be detected" means that, when the saturation in the amplifier to be detected is detected, the gain of the amplifier to be controlled is decreased or increased.

The gain control circuit 601 supplies the bias to the power-stage amplifier 551 and controls the gain of the variable gain amplifier 501 based on the degree of saturation in the power-stage amplifier 551 through analog control. In the ninth embodiment, the gain control circuit 601 decreases the gain of the variable gain amplifier 501 upon detection of the saturation in the power-stage amplifier 551.

Figure 10:
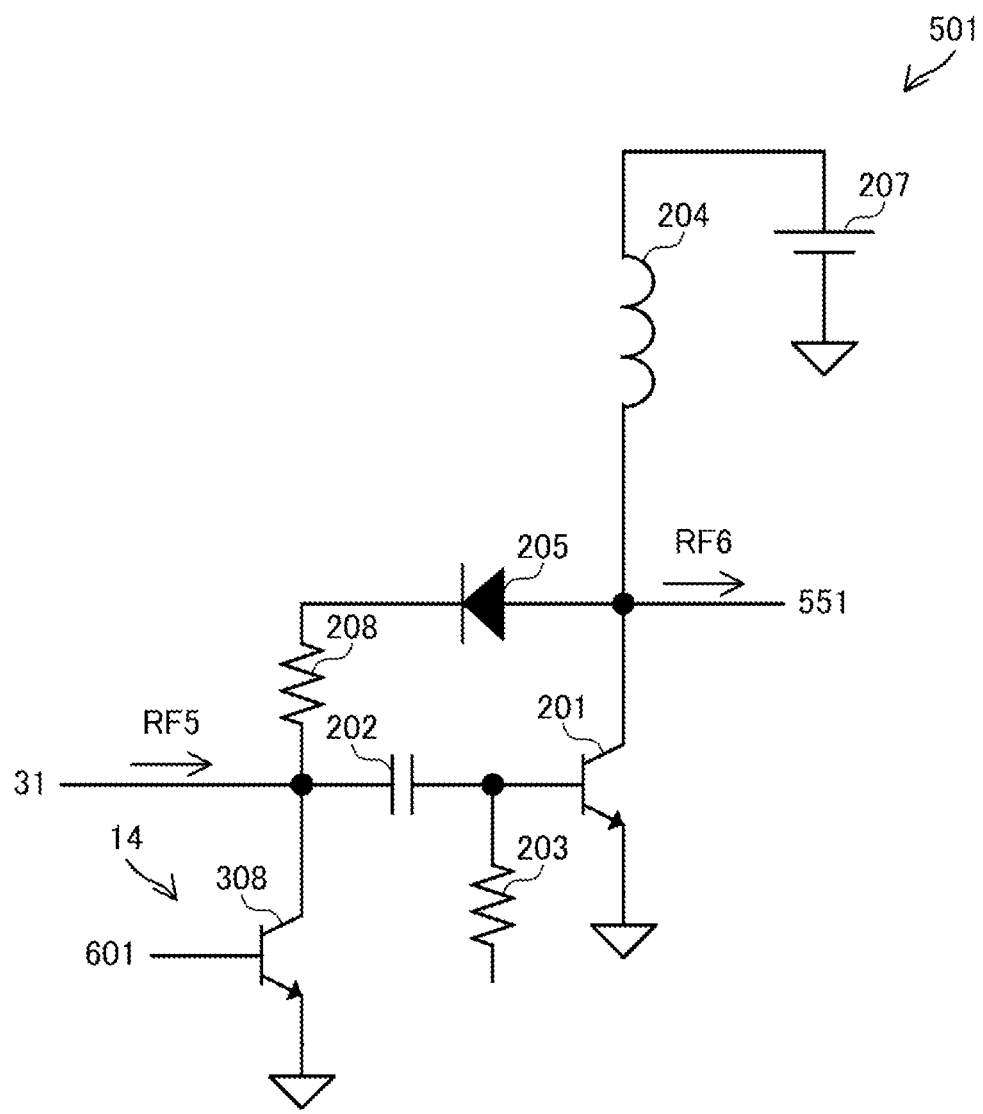
FIG. 10 is a circuit diagram of a variable gain amplifier in the ninth embodiment.

The multistage amplifier circuit 109 will now be described in detail. FIG. 10 is a circuit diagram of the variable gain amplifier 501. As illustrated in FIG. 10, the variable gain amplifier 501 includes a current control circuit 14, the first amplifier transistor 201, the capacitor 202, the resistive element 203, the inductor 204, the diode 205 (the first nonlinear circuit element and the first diode), the voltage power supply 207, and the resistive element 208 (the first resistive element). The current control circuit 14 includes a transistor 308 (a second transistor).

The first amplifier transistor 201, the capacitor 202, the resistive element 203, the inductor 204, the diode 205, the voltage power supply 207, and the resistive element 208 in the variable gain amplifier 501 are the same as the first amplifier transistor 201, the capacitor 202, the resistive element 203, the inductor 204, the diode 205, the voltage power supply 207, and the resistive element 208 in the power amplifier circuit 103 illustrated in FIG. 3.

The transistor 308 in the current control circuit 14 has a collector connected to the first end of the capacitor 202, a base connected to the gain control circuit 601, and an emitter that is grounded. The collector current of the transistor 308 is adjusted using the control signal supplied from the gain control circuit 601 to the base of the transistor 308. Varying the collector current of the transistor 308 enables the current flowing through the diode 205 to be varied.

Since the adjustment of the current flowing through the diode 205 using the control signal enables the equivalent resistance value of the diode 205 to be adjusted, the amount of feedback of the amplified signal RF6 from the collector of the first amplifier transistor 201 to the base thereof is capable of being adjusted. Accordingly, it is possible to adjust the gain of the first amplifier transistor 201.

Figure 11:
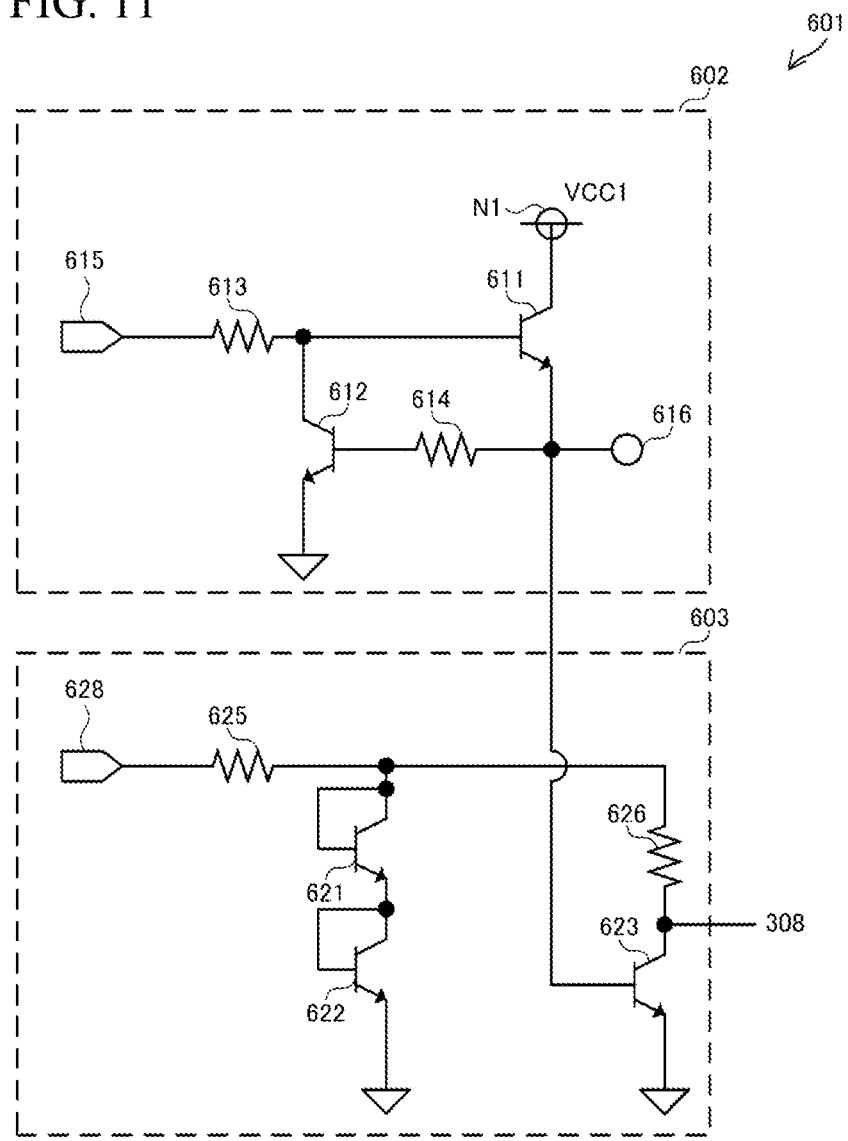
FIG. 11 is a circuit diagram of a gain control circuit in the ninth embodiment.

FIG. 11 is a circuit diagram of the gain control circuit 601. As illustrated in FIG. 11, the gain control circuit 601 includes a bias supply circuit 602 and a VGA control circuit 603. The bias supply circuit 602 includes transistors 611 and 612 and resistive elements 613 and 614. The VGA control circuit 603 includes transistors 621, 622, and 623 and resistive elements 625 and 626.

A bias supply terminal 616 is connected to, for example, the base of an amplifier transistor (not illustrated) included in the power-stage amplifier 551 (refer to FIG. 9). The bias supply circuit 602 supplies base potential appropriate for the power-stage amplifier 551 to the power-stage amplifier 551 via the bias supply terminal 616. Specifically, for example, control current for controlling the bias of the power-stage amplifier 551 is externally supplied to a bias control signal input terminal 615. Power supply voltage VCC1 is externally supplied to a power supply voltage supplying node N1.

The transistor 611 has a collector connected to the power supply voltage supplying node N1, a base connected to the bias control signal input terminal 615 via the resistive element 613, and an emitter connected to the bias supply terminal 616.

The transistor 612 has a collector connected to the base of the transistor 611, a base connected to the emitter of the transistor 611 via the resistive element 614, and an emitter that is grounded.

Bias voltage resulting from addition of the base-emitter voltage Vbe of the transistor 612 to the voltage between the terminals of the resistive element 614 is supplied to the power-stage amplifier 551 via the bias supply terminal 616.

When the power-stage amplifier 551 is saturated, the base current flowing from the bias supply terminal 616 to the power-stage amplifier 551 is increased. At this time, the bias voltage at the bias supply terminal 616 is decreased. In other words, the bias voltage at the bias supply terminal 616 is used as a detection signal for detecting the saturation in the power-stage amplifier 551.

The VGA control circuit 603 generates the control signal for controlling the gain of the variable gain amplifier 501 based on the detection signal to supply the generated control signal to the transistor 308.

Specifically, the transistor 621 is diode-connected and has a collector connected to a VGA control voltage input terminal 628 via the resistive element 625 and an emitter. The transistor 622 is diode-connected and has a collector connected to the emitter of the transistor 621 and an emitter that is grounded.

The resistive element 626 has a first end connected to the collector of the transistor 621 and a second end. The transistor 623 has a collector connected to the second end of the resistive element 626 and the base of the transistor 308 (refer to FIG. 10), a base connected to the emitter of the transistor 611, and an emitter that is grounded.

Voltage for generating reference voltage is externally supplied to the VGA control voltage input terminal 628. Since each of the transistors 621 and 622 functions as a diode, voltage drop corresponding to the two diodes occurs on a path between the collector of the transistor 621 and the emitter thereof and a path between the collector of the transistor 622 and the emitter thereof. In other words, collector voltage of the transistor 621 based on the ground, that is, the reference voltage is voltage of a level corresponding to the voltage drop corresponding to the two diodes.

Collector voltage of the transistor 623 is voltage resulting from subtraction of the voltage between the terminals of the resistive element 626 from the reference voltage. Current corresponding to the detection signal supplied to the base of the transistor 623 flows through the resistive element 626.

Specifically, since the saturation in the power-stage amplifier 551 decreases the voltage value of the detection signal, the current flowing through the resistive element 626 and the collector of the transistor 623 is decreased. Accordingly, the voltage between the terminals of the resistive element 626 is decreased to increase the collector voltage of the transistor 623, that is, the voltage of the control signal.

As illustrated in FIG. 10, since the current flowing through the diode 205 is increased to reduce the gain of the first amplifier transistor 201 when the voltage of the control signal is made high, the power of the amplified signal RF6 input into the power-stage amplifier 551 is decreased. As a result, the power-stage amplifier 551 is released from the saturation operation.

For example, when the power-stage amplifier 551 continues the saturation operation, the communication quality may be reduced or, in the worst case, the power-stage amplifier 551 may be broken due to distortion of the amplified signal RF7. In addition, the power at which the power-stage amplifier 551 is saturated is varied depending on various factors including an output load and the environmental temperature. Accordingly, in design of an amplifier in the related art, which does not perform the control against the saturation, it is suitable to increase the margin for saturation power.

In contrast, in the multistage amplifier circuit 109, the gain control circuit 601 performs control so as to reduce the gain of the variable gain amplifier 501 upon detection of the saturation in the power-stage amplifier 551. Since the power-stage amplifier 551 is released from the saturation operation in this case, it is possible to suppress the reduction in the communication quality and the breaking of the power-stage amplifier 551. In addition, it is possible to decrease the margin for the saturation power, compared with that in the amplifier in the related art.

Although the multistage amplifier circuit 109 is described to have the configuration including the gain control circuit 601, the configuration of the multistage amplifier circuit 109 is not limited to this. The multistage amplifier circuit 109 may have a configuration including a gain control circuit that controls the gain of the variable gain amplifier 501 without detecting the saturation in the power-stage amplifier 551. Such a gain control circuit controls the gain of the variable gain amplifier 501 based on, for example, the communication distance to a base station to increase or decrease transmission power of the RF signal.

Although the multistage amplifier circuit 109 is described as the two-stage amplifier circuit, the configuration of the multistage amplifier circuit 109 is not limited to this. The multistage amplifier circuit 109 may be an amplifier circuit of three or more stages. In this case, for example, the variable gain amplifier 501 is provided at the first stage in the multistage amplifier circuit 109. For example, the gain control circuit 601 supplies the bias to the final-stage amplifier and detects the saturation in the final-stage amplifier.

Although the variable gain amplifier 501 is described to have the configuration including the diode 205 and the resistive element 208, which are connected in series to each other, between the collector of the first amplifier transistor 201 and the base thereof, the configuration of the variable gain amplifier 501 is not limited to this. The variable gain amplifier 501 may have the configuration including only the diode 205 (refer to FIG. 1) between the collector of the first amplifier transistor 201 and the base thereof, the configuration including the diodes 205 and 209, which are connected in series to each other (refer to FIG. 4) between the collector of the first amplifier transistor 201 and the base thereof, or the configuration including the voltage multiplier circuit 210 (refer to FIG. 5) between the collector of the first amplifier transistor 201 and the base thereof.

Tenth Embodiment

Figure 12:
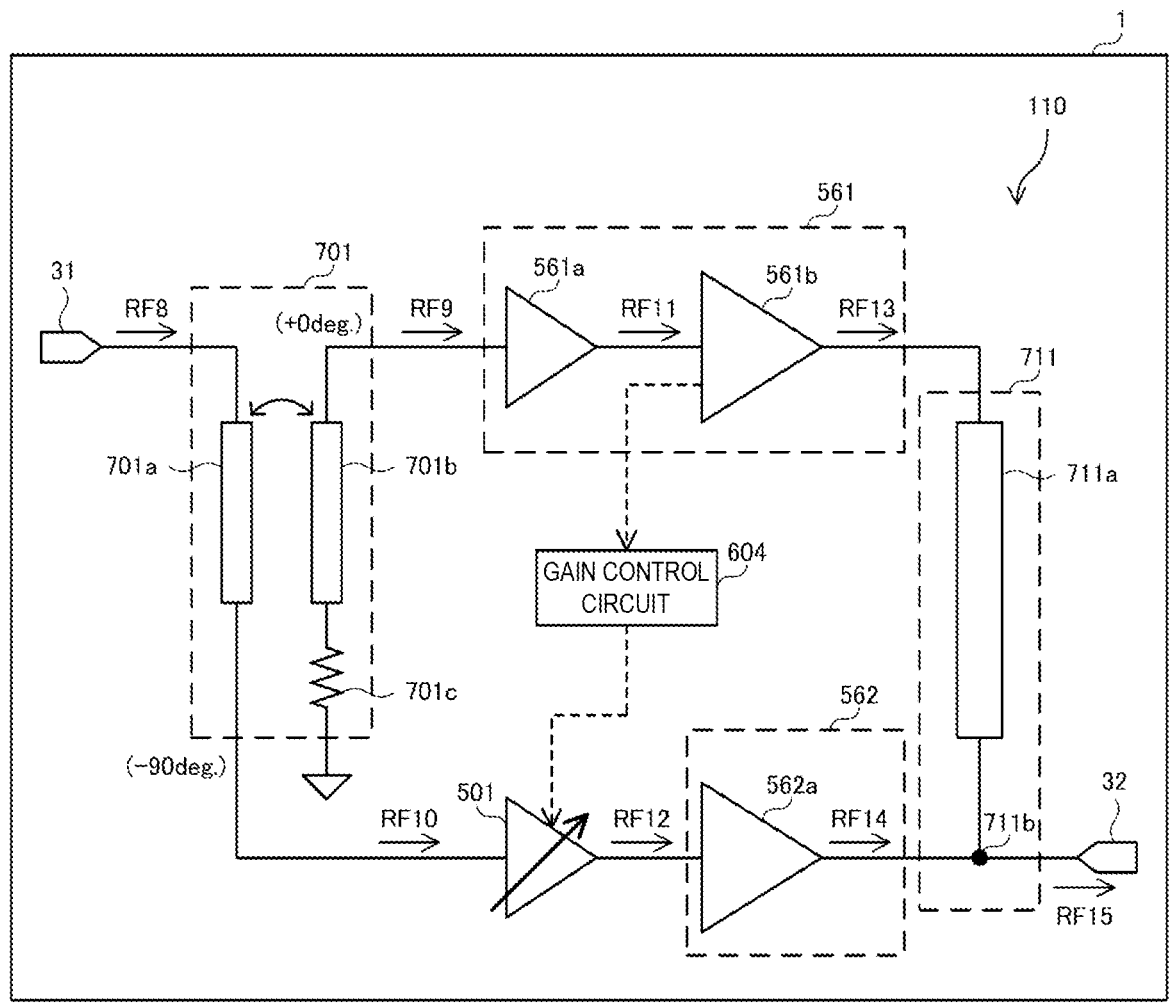
FIG. 12 is a circuit diagram of a Doherty amplifier circuit according to a tenth embodiment of the present disclosure.

A Doherty amplifier circuit 110 according to a tenth embodiment will now be described. FIG. 12 is a circuit diagram of the Doherty amplifier circuit 110. As illustrated in FIG. 12, the Doherty amplifier circuit 110 according to the tenth embodiment differs from the multistage amplifier circuit 109 according to the ninth embodiment in that the variable gain amplifier 501 is used as a peak-side driver-stage amplifier.

The Doherty amplifier circuit 110 includes the variable gain amplifier 501 (the power amplifier circuit), a carrier circuit 561, a peak circuit 562, a gain control circuit 604, a splitter 701, and a combiner 711.

The carrier circuit 561 includes a driver-stage carrier amplifier 561a and a power-stage carrier amplifier 561b. The peak circuit 562 includes a power-stage peak amplifier 562a. The carrier circuit 561 may have a configuration including three or more carrier amplifiers. The peak circuit 562 may have a configuration including two or more peak amplifiers.

The splitter 701 splits a signal RF8 (a fifth signal) into a signal RF9 (a sixth signal) and a signal RF10 (a seventh signal) having a phase different from that of the signal RF9. In the tenth embodiment, the splitter 701 is a 90-degree coupler and includes a line 701a, a line 701b, and a resistive element 701c.

The line 701a has a first end into which the signal RF8 is input via the input terminal 31 and a second end which is connected to the input terminal of the variable gain amplifier 501 and from which the signal RF10 is output. The line 701b has a first end which is connected to the input terminal of the driver-stage carrier amplifier 561a and from which the signal RF9 is output and a second end that is grounded via the resistive element 701c. The line 701b is electromagnetically coupled to the line 701a. The phase of the signal RF10 is shifted from the phase of the signal RF9 by approximately 90°.

The driver-stage carrier amplifier 561a in the carrier circuit 561 amplifies the signal RF9 supplied from the first end of the line 701b and supplies an amplified signal RF11 resulting from amplification of the signal RF9 to the power-stage carrier amplifier 561b. The power-stage carrier amplifier 561b amplifies the amplified signal RF11 and supplies an amplified signal RF13 resulting from amplification of the amplified signal RF11 to the combiner 711.

The variable gain amplifier 501 amplifies the signal RF10 supplied from the second end of the line 701a and supplies an amplified signal RF12 (an eighth signal) resulting from amplification of the signal RF10 to the peak circuit 562.

The power-stage peak amplifier 562a in the peak circuit 562 amplifies the amplified signal RF12 supplied from the variable gain amplifier 501 and supplies an amplified signal RF14 resulting from the amplification of the amplified signal RF12 to the combiner 711.

The combiner 711 combines the amplified signal RF13 with the amplified signal RF14 and supplies an output signal RF15, which is the amplified signal of the signal RF8, to the output terminal 32.

In the tenth embodiment, the combiner 711 includes a ¼ wavelength line 711a and a node 711b. The ¼ wavelength line 711a has a first end connected to the output terminal of the power-stage carrier amplifier 561b and a second end connected to the node 711b. The node 711b is provided on a path with which the power-stage peak amplifier 562a is connected to the output terminal 32.

Figure 13:
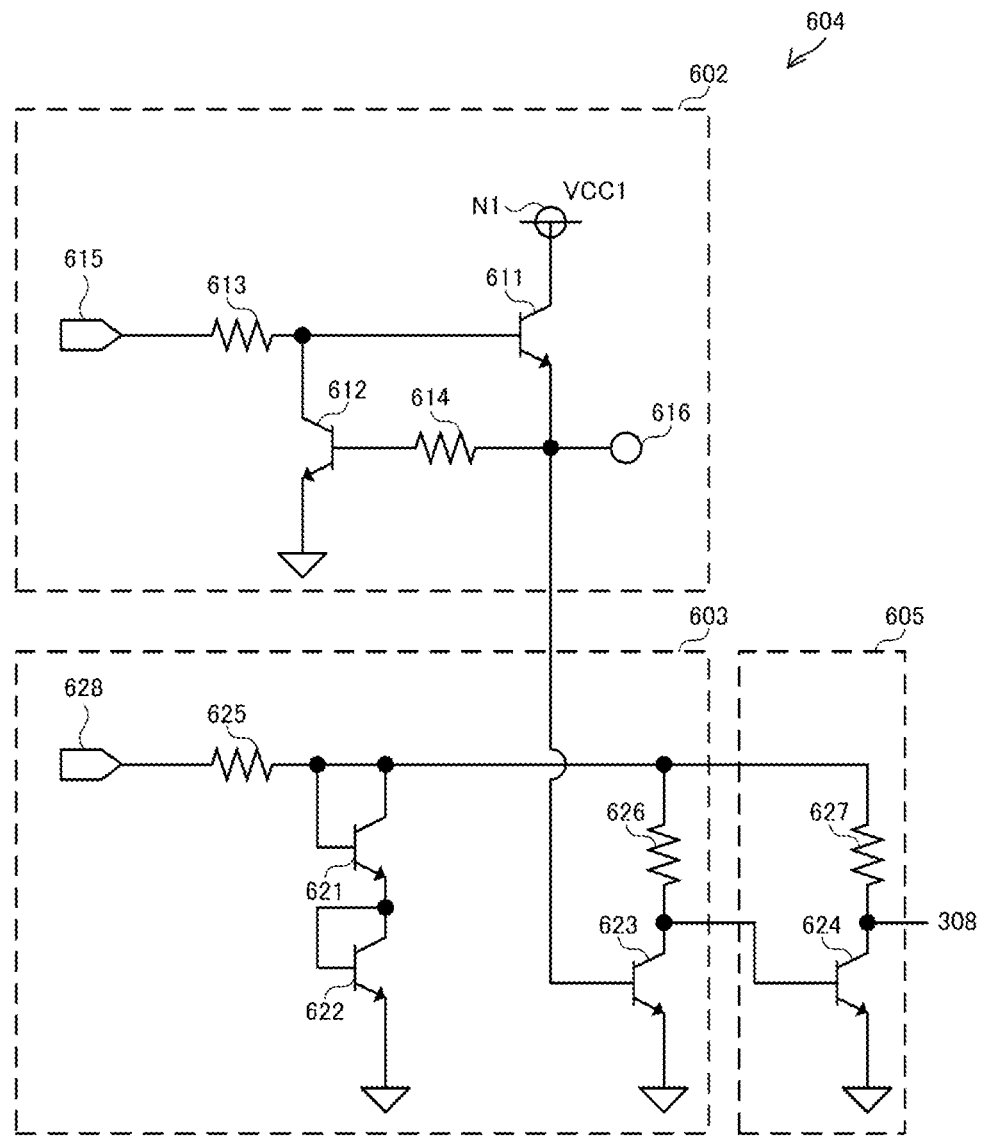
FIG. 13 is a circuit diagram of a gain control circuit in the tenth embodiment.

FIG. 13 is a circuit diagram of the gain control circuit 604. As illustrated in FIG. 13, the gain control circuit 604 further includes an inverting amplifier circuit 605, in addition to the components in the gain control circuit 601 illustrated in FIG. 11. The inverting amplifier circuit 605 includes a resistive element 627 and a transistor 624.

The bias supply terminal 616 is connected to, for example, the base of an amplifier transistor (not illustrated) included in the power-stage carrier amplifier 561*b* (refer to FIG. 12).

The resistive element 627 has a first end connected to the collector of the transistor 621 and a second end. The transistor 624 has a collector connected to the second end of the resistive element 627 and the base of the transistor 308 (refer to FIG. 10), a base connected to the collector of the transistor 623, and an emitter that is grounded.

As illustrated in FIG. 12 and FIG. 13, the gain control circuit 604 supplies the bias to the power-stage carrier amplifier 561*b* closest to the output side in the carrier circuit 561 and controls the gain of the variable gain amplifier 501 based on the degree of saturation in the power-stage carrier amplifier 561*b* through the analog control.

In the tenth embodiment, the gain control circuit 604 performs control so as to increase the gain of the variable gain amplifier 501 upon detection of the saturation in the power-stage carrier amplifier 561*b*. Specifically, the inverting amplifier circuit 605 supplies the control signal resulting from inverting amplification of the collector voltage of the transistor 623 to the transistor 308 (refer to FIG. 10). As described above, when the power-stage amplifier 551 is saturated, the collector voltage of the transistor 623 is increased. In other words, the voltage of the control signal supplied from the inverting amplifier circuit 605 to the transistor 308 is decreased when the power-stage amplifier 551 is saturated.

As illustrated in FIG. 10 and FIG. 12, since the current flowing through the diode 205 is decreased and the gain of the first amplifier transistor 201 is increased upon decrease of the voltage of the control signal, the power of the amplified signal RF12 input into the power-stage peak amplifier 562*a* is increased. Accordingly, the Doherty amplifier circuit 110 operates so that the power output from the power-stage peak amplifier 562*a* is increased when the power-stage carrier amplifier 561*b* is saturated.

The power-stage carrier amplifier 561*b* is released from the saturation state due to the effect of load modulation of the Doherty amplifier circuit 110. Since this enables the continuous saturation in the power-stage carrier amplifier 561*b* to be suppressed, it is possible to suppress the reduction in the communication quality and the breaking of the power-stage carrier amplifier 561*b*.

With the configuration in which an increase in the base current of the power-stage carrier amplifier 561*b*, which causes the saturation in the power-stage carrier amplifier 561*b*, is detected, it is possible to shorten the time from the saturation in the power-stage carrier amplifier 561*b* to completion of the control to increase the gain of the variable gain amplifier 501.

Exemplary embodiments of the present disclosure are described above. In the multistage amplifier circuit 109 or the Doherty amplifier circuit 110, the first amplifier transistor 201 has the base into which the signal RF5 is input, the collector from which the amplified signal RF6 resulting from amplification of the signal RF5 is output, and the emitter that is grounded. The first nonlinear circuit element is connected between the collector of the first amplifier transistor 201 and the base of the first amplifier transistor 201. The current control circuit 14 is connected between the ground and the base of the first amplifier transistor 201 to control the current flowing through the first nonlinear circuit element.

As described above, the equivalent resistance value of the first nonlinear circuit element is capable of being varied with the simple circuit configuration in which the current flowing through the first nonlinear circuit element is controlled by the current control circuit 14. This enables the amount of feedback of the amplified signal RF6 from the collector of the first amplifier transistor 201 to the base thereof to be adjusted. Since the power of the signal RF5 is capable of being decreased with the amplified signal RF6 having voltage polarity opposite to that of the signal RF5, the increase in the amount of feedback enables the gain of the first amplifier transistor 201 to be decreased. Accordingly, it is possible to realize the adjustment of the gain in the amplification of the input signal with the simple circuit configuration.

In the multistage amplifier circuit 109 or the Doherty amplifier circuit 110, the first nonlinear circuit element is the diode 205 having the anode connected to the collector of the first amplifier transistor 201 and the cathode connected the base of the first amplifier transistor 201.

With the above configuration, it is possible to simply realize the first nonlinear circuit element capable of varying the equivalent resistance value with the flowing current.

The multistage amplifier circuit 109 or the Doherty amplifier circuit 110 further includes the resistive element 208, which is connected in series or in parallel to the diode 205, between the collector of the first amplifier transistor 201 and the base of the first amplifier transistor 201.

As described above, with the configuration in which the diode 205 is connected in series to the resistive element 208, the lower limit of the combined resistance value of the resistive element 208 and the diode 205 is capable of being adjusted with the resistance value of the resistive element 208. Accordingly, it is possible to adjust the lower limit of the gain of the first amplifier transistor 201. In addition, with the configuration in which the diode 205 is connected in parallel to the resistive element 208, the upper limit of the combined resistance value of the resistive element 208 and the diode 205 is capable of being adjusted with the resistance value of the resistive element 208. Accordingly, it is possible to adjust the upper limit of the gain of the first amplifier transistor 201.

The multistage amplifier circuit 109 or the Doherty amplifier circuit 110 further includes the diode 209, which is connected in series to the diode 205 between the collector of the first amplifier transistor 201 and the base of the first amplifier transistor 201.

With the above configuration, the variable range of the combined resistance value of the diodes 205 and 209 is capable of being increased to approximately two times of the variable range of the equivalent resistance value of the diode 205. Accordingly, it is possible to widen the adjustment range of the gain of the first amplifier transistor 201 and to increase the maximum gain.

In addition, in the multistage amplifier circuit 109 or the Doherty amplifier circuit 110, the first nonlinear circuit element includes the transistor 210*a* having the collector connected to the collector of the first amplifier transistor 201, the base, and the emitter connected to the base of the first amplifier transistor 201. The resistive element 210*b* is connected between the collector of the transistor 210*a* and the base of the transistor 210*a*. The resistive element 210*c* is connected between the base of the transistor 210*a* and the emitter of the transistor 210*a*.

With the above configuration, appropriately selecting the resistance value of the resistive element 210b and the resistance value of the resistive element 210c enables the voltage between the collector and the emitter of the transistor 210a to be substantially fixed to the voltage corresponding to these resistance values. Adjusting the current flowing through the resistive elements 210b and 210c and the transistor 210a enables the equivalent resistance value between the collector and the emitter of the transistor 210a to be adjusted. In other words, it is possible to adjust the gain of the first amplifier transistor 201. In addition, since the voltage between the collector and the emitter of the transistor 210a is capable of being arbitrarily set, the range of the equivalent resistance value between the collector and the emitter of the transistor 210a is capable being adjusted. In other words, it is possible to adjust the range of the gain of the first amplifier transistor 201. Consequently, it is possible to improve the degree of freedom of design of the multistage amplifier circuit 109 or the Doherty amplifier circuit 110.

In the multistage amplifier circuit 109 or the Doherty amplifier circuit 110, the current control circuit 14 includes the transistor 308 having the collector connected to the base of the first amplifier transistor 201, the base into which the control signal is input, and the emitter that is grounded.

With the above configuration, it is possible to simply realize the configuration in which increase and decrease of the current flowing through the first nonlinear circuit element is controlled with the control signal.

In the power amplifier circuits 101 to 107, the second amplifier transistor 251 has the base into which the signal RFm1 having the phase different from that of the signal RFp1 is input, the collector from which the amplified signal RFm2 resulting from amplification of the signal RFm1 is output, and the emitter that is grounded. The second nonlinear circuit element is connected between the collector of the second amplifier transistor 251 and the base of the second amplifier transistor 251. The current control circuit 11, 12, or 13 is connected between the ground, and the base of the first amplifier transistor 201 and the base of the second amplifier transistor 251 and controls the current flowing through the first nonlinear circuit element and the current flowing through the second nonlinear circuit element.

With the above configuration, it is possible to realize the variable gain differential amplifier circuit with the simple circuit configuration.

In the power amplifier circuit 108, the first amplifier transistor 201 has the base into which the signal RFp1 is input, the collector from which the amplified signal RFp2 resulting from amplification of the signal RFp1 is output, and the emitter that is grounded. The second amplifier transistor 251 has the base into which the signal RFm1 having a phase different from that of the signal RFp1 is input, the collector from which the amplified signal RFm2 resulting from amplification of the signal RFm1 is output, and the emitter that is grounded. The first nonlinear circuit element is connected between the collector of the second amplifier transistor 251 and the base of the first amplifier transistor 201. The second nonlinear circuit element is connected between the collector of the first amplifier transistor 201 and the base of the second amplifier transistor 251. The current control circuit 11, 12, or 13 is connected between the ground, and the base of the first amplifier transistor 201 and the base of the second amplifier transistor 251 and controls the current flowing through the first nonlinear circuit element and the current flowing through the second nonlinear circuit element.

As described above, with the configuration in which the first nonlinear element having the junction capacitance is connected between the collector of the second amplifier transistor 251 and the base of the first amplifier transistor 201, the amplified signal RFm2 is capable of being supplied from the collector of the second amplifier transistor 251 to the base of the first amplifier transistor 201 via the junction capacitance. Accordingly, the amplified signal RFp2 returning from the collector of the first amplifier transistor 201 to the base thereof via the junction capacitance 201a is capable of being canceled with the amplified signal RFm2 having a phase opposite to that of the amplified signal RFp2. Consequently, it is possible to suppress the reduction in the gain of the first amplifier transistor 201 and the degradation of the input dependency of the pass phase characteristics. In addition, with the configuration in which the second nonlinear circuit element having the junction capacitance is connected between the collector of the first amplifier transistor 201 and the base of the second amplifier transistor 251, the amplified signal RFp2 is capable of being supplied from the collector of the first amplifier transistor 201 to the base of the second amplifier transistor 251 via the junction capacitance. Accordingly, the amplified signal RFm2 returning from the collector of the second amplifier transistor 251 to the base thereof via the junction capacitance 251a is capable of being canceled with the amplified signal RFp2 having a phase opposite to that of the amplified signal RFm2. Consequently, it is possible to suppress the reduction in the gain of the second amplifier transistor 251 and the degradation of the input dependency of the pass phase characteristics.

In the current control circuit 12 in the power amplifier circuits 102 to 106 and the power amplifier circuit 108, the primary-side inductor 402 has the first end and the second end. The inductor 403a is electromagnetically coupled to the primary-side inductor 402 and has the first end connected to the base of the first amplifier transistor 201 and the second end. The inductor 403b is electromagnetically coupled to the primary-side inductor 402 and has the first end connected to the second end of the inductor 403a and the second end connected to the base of the second amplifier transistor 251. The transistor 304 has the collector connected to the second end of the inductor 403a and the first end of the inductor 403b, the base into which the control signal is input, and the emitter that is grounded.

With the above configuration, since output of the radio-frequency signal from the node between the inductor 403a and the inductor 403b to the transistor 304 is suppressed, reflection of the radio-frequency signal by the parasitic capacitance 304a of the transistor 304 is suppressed. Accordingly, the reduction in the quality of the radio-frequency signal and an occurrence of malfunction are capable of being suppressed. In addition, the potential of the base, which is higher than the potential of the collector, is capable of being suppressed in the transistor 304. Accordingly, it is possible to suppress shift of the bias points of the first amplifier transistor 201 and the second amplifier transistor 251 and unstable current flowing through the first nonlinear circuit element and the second nonlinear circuit element. In other words, it is possible to realize the variable gain differential amplifier circuit that operates well for the radio-frequency signal.

In the current control circuit 12 in the power amplifier circuits 102 to 106 and the power amplifier circuit 108, the inductor 403a has approximately the same inductance as the inductance of the inductor 403b.

With the above configuration, since output of the radio-frequency signal from the node between the inductor 403a and the inductor 403b to the transistor 304 is made approximately zero, the reduction in the quality of the radio-frequency signal and an occurrence of malfunction are capable of being prevented. In addition, it is possible to prevent the shift of the bias points of the first amplifier transistor 201 and the second amplifier transistor 251 and to stabilize the current flowing through the first nonlinear circuit element and the second nonlinear circuit element.

In the current control circuit 12 in the power amplifier circuits 102 to 105 and the power amplifier circuit 108, the signal RFp3 is input into the first end of the primary-side inductor 402. The signal RFm3 having a phase different from that of the signal RFp3 is input into the second end of the primary-side inductor 402.

With the above configuration, since the primary-side inductor 402 and the inductors 403a and 403b function as matching circuits, it is possible to realize the variable gain differential amplifier circuit that operates well for the differential signal in a high-frequency band.

In the current control circuit 12 in the power amplifier circuit 106, the signal RF4 is input into the first end of the primary-side inductor 402. The second end of the primary-side inductor 402 is grounded.

With the above configuration, since the primary-side inductor 402 and the inductors 403a and 403b function as a balun, it is possible to realize the variable gain differential amplifier circuit that operates well for the single-ended signal in a high-frequency band.

The current control circuit 11 in the power amplifier circuit 101 include the transistors 302 and 303. The transistor 302 has the collector connected to the base of the first amplifier transistor 201, the base into which the control signal is input, and the emitter that is grounded. The transistor 303 has the collector connected to the base of the second amplifier transistor 251, the base connected to the base of the transistor 302, and the emitter that is grounded.

With the above configuration, the current flowing through each of the first nonlinear circuit element and the second nonlinear circuit element is capable of being adjusted with the collector current of the transistor 302 and the collector current of the transistor 303. The collector current is capable of being adjusted through simple control in which the control signal is supplied to the bases of the transistors 302 and 303. In other words, it is possible to adjust the current flowing through each of the first nonlinear circuit element and the second nonlinear circuit element through the simple configuration and control.

The current control circuit 13 in the power amplifier circuit 107 includes the inductors 305 and 306 and the transistor 307. The inductor 305 has the first end connected to the base of the first amplifier transistor 201 and the second end. The inductor 306 has the first end connected to the base of the second amplifier transistor 251 and the second end. The transistor 307 has the collector connected to the second end of the inductor 305 and the second end of the inductor 306, the base into which the control signal is input, and the emitter that is grounded.

With the above configuration, the current flowing through each of the first nonlinear circuit element and the second nonlinear circuit element is capable of being adjusted with the collector current of the transistor 307 while suppressing short-circuiting of the base of the first amplifier transistor 201 and the base of the second amplifier transistor 251 with an alternating current signal. The collector current is capable of being adjusted through the simple control in which the control signal is supplied to the base of the transistor 307. In other words, it is possible to adjust the current flowing through each of the first nonlinear circuit element and the second nonlinear circuit element through the simpler configuration and control.

In the Doherty amplifier circuit 110, the splitter 701 splits the signal RF8 into the signal RF9 and the signal RF10 having a phase different from that of the signal RF9. The carrier circuit 561 includes two or more carrier amplifiers. The carrier circuit 561 amplifies the signal RF9 and outputs the amplified signal RF13 resulting from amplification of the signal RF9. The variable gain amplifier 501 amplifies the signal RF10 and outputs the amplified signal RF12 resulting from amplification of the signal RF10. The peak circuit 562 includes one or more peak amplifiers. The peak circuit 562 amplifies the amplified signal RF12 supplied from the variable gain amplifier 501 and outputs the amplified signal RF14 resulting from amplification of the amplified signal RF12. The gain control circuit 604 controls the gain of the variable gain amplifier 501 based on the degree of saturation in the power-stage carrier amplifier 561b closest to the output side in the carrier circuit 561.

With the above configuration, for example, when the saturation in the power-stage carrier amplifier 561b is detected by the gain control circuit 604, the gain of the variable gain amplifier 501 is capable of being increased. This avoids continuation of a situation in which the peak circuit 562 does not operate despite the saturation in the power-stage carrier amplifier 561b. Since the power-stage carrier amplifier 561b is released from the saturation state due to the effect of the load modulation of the Doherty amplifier circuit 110, it is possible to suppress the reduction in the communication quality and the breaking, which are caused by the continuous saturation in the power-stage carrier amplifier 561b.

In the multistage amplifier circuit 109, the variable gain amplifier 501 amplifies the signal RF5 and outputs the amplified signal RF6 resulting from amplification of the signal RF5. The power-stage amplifier 551 amplifies the signal RF5 amplified by the variable gain amplifier 501, that is, the amplified signal RF6. The gain control circuit 601 controls the gain of the variable gain amplifier 501.

With the above configuration, since the gain of the variable gain amplifier 501 is capable of being adjusted through external control, it is possible to increase or decrease the transmission power of the RF signal based on, for example, the communication distance to the base station.

In the multistage amplifier circuit 109, the gain control circuit 601 controls the gain of the variable gain amplifier 501 based on the degree of saturation in the power-stage amplifier 551.

With the above configuration, for example, when the saturation in the power-stage amplifier 551 is detected by the gain control circuit 601, the gain of the variable gain amplifier 501 is capable of being decreased. Since this releases the power-stage amplifier 551 from the saturation state, it is possible to suppress the reduction in the communication quality and the breaking, which are caused by the continuous saturation in the power-stage amplifier 551.

The power amplifier apparatus includes the compound semiconductor 1 having semiconductor devices formed therein and thereon. The semiconductor devices are included in one of the power amplifier circuits 101 to 108, the multistage amplifier circuit 109, or the Doherty amplifier circuit 110.

With the above configuration, the control of the current flowing through the first nonlinear circuit element or the second nonlinear circuit element and the detection of the saturation in the amplifier are capable of being performed with an analog signal without using a digital signal. Since this enables the control without any processing, such as conversion of data and calculation, for example, it is possible to complete the processing from the detection of the saturation in the amplifier to the control of the gain for a very short time. Accordingly, since the time when the saturation in the amplifier occurs is shortened, it is possible to suppress degradation in the quality of the amplified signal. In addition, since the formation of each semiconductor device on the same compound semiconductor 1 shortens the transmission distance of the signals exchanged between the semiconductor devices, it is possible to realize higher-speed control.

The respective embodiments are described above for facilitating the understanding of the present disclosure and are not intended to limit the interpretation of the present disclosure. Modifications and/or changes of the present disclosure may be made without departing from the intent of the present disclosure and equivalents are also included in the present disclosure. In other words, embodiments appropriately subjected to design change by the person skilled in the art are also included in the scope of the present disclosure as long as they have features of the present disclosure. For example, the components in the respective embodiments and the arrangement, the materials, the conditions, the shapes, the sizes, and so on of the components are not limited to the ones that are exemplified and may be appropriately modified. The respective embodiments are only examples, and partial replacement or combination of the components described in different embodiments is available and is included in the scope of the present disclosure as long as it has features of the present disclosure.

What is claimed is:

1. A power amplifier circuit comprising:
  a first amplifier transistor having a base or a gate into which a first signal is input, a collector or a drain from which a first amplified signal resulting from amplification of the first signal is output, and an emitter or a source that is grounded;
  a first nonlinear circuit element connected between the collector or the drain of the first amplifier transistor and the base or the gate of the first amplifier transistor; and
  a current control circuit connected between ground and the base or the gate of the first amplifier transistor, and configured to control current flowing through the first nonlinear circuit element.

2. The power amplifier circuit according to claim 1, wherein the first nonlinear circuit element is a first diode having an anode connected to the collector or the drain of the first amplifier transistor and a cathode connected to the base or the gate of the first amplifier transistor.

3. The power amplifier circuit according to claim 2, further comprising:
  a first resistive circuit element connected in series or in parallel with the first diode between the collector or the drain of the first amplifier transistor and the base or the gate of the first amplifier transistor.

4. The power amplifier circuit according to claim 2, further comprising:
  a second diode connected in series with the first diode between the collector or the drain of the first amplifier transistor and the base or the gate of the first amplifier transistor, and having an anode connected to the collector or the drain of the first amplifier transistor and a cathode connected to the base or the gate of the first amplifier transistor.

5. The power amplifier circuit according to claim 1, wherein the first nonlinear circuit element comprises a first transistor having a collector or a drain connected to the collector or the drain of the first amplifier transistor, a base or a gate, and an emitter or a source connected to the base or the gate of the first amplifier transistor, and
  wherein the power amplifier circuit further comprises:
  a second resistive circuit element connected between the collector or the drain of the first transistor and the base or the gate of the first transistor; and
  a third resistive circuit element connected between the base or the gate of the first transistor and the emitter or the source of the first transistor.

6. The power amplifier circuit according to claim 1, wherein the current control circuit comprises:
  a second transistor that has a collector or a drain connected to the base or the gate of the first amplifier transistor, a base or a gate into which a control signal is input, and an emitter or a source that is grounded.

7. A power amplifier circuit comprising:
  a first amplifier transistor having a base or a gate into which a first signal is input, a collector or a drain from which a first amplified signal resulting from amplification of the first signal is output, and an emitter or a source that is grounded;
  a second amplifier transistor having a base or a gate into which a second signal is input, a collector or a drain from which a second amplified signal resulting from amplification of the second signal is output, and an emitter or a source that is grounded;
  a first nonlinear circuit element connected between the collector or the drain of the second amplifier transistor and the base or the gate of the first amplifier transistor;
  a second nonlinear circuit element connected between the collector or the drain of the first amplifier transistor and the base or the gate of the second amplifier transistor; and
  a current control circuit connected between ground and the base or the gate of the first amplifier transistor, and between ground and the base or the gate of the second amplifier transistor, the current control circuit being configured to control current flowing through the first nonlinear circuit element and current flowing through the second nonlinear circuit element,
  wherein the second signal has a different phase than the first signal.

8. The power amplifier circuit according to claim 7, wherein the current control circuit comprises:
  a first line that has a first end and a second end;
  a second line that is electromagnetically coupled to the first line and that has a first end connected to the base or the gate of the first amplifier transistor and a second end;
  a third line that is electromagnetically coupled to the first line and that has a first end connected to the second end of the second line and a second end connected to the base or the gate of the second amplifier transistor; and
  a third transistor that has a collector or a drain connected to the second end of the second line and the first end of the third line, a base or a gate into which a control signal is input, and an emitter or a source that is grounded.

9. The power amplifier circuit according to claim 8, wherein the second line has approximately the same inductance as an inductance of the third line.

10. The power amplifier circuit according to claim 8,
wherein a third signal is input into the first end of the first line, and
wherein a fourth signal is input into the second end of the first line, the fourth signal having a different phase than the third signal.

11. The power amplifier circuit according to claim 8,
wherein a third signal is input into the first end of the first line, and
wherein the second end of the first line is grounded.

12. The power amplifier circuit according to claim 7, wherein the current control circuit comprises:
a fourth transistor that has a collector or a drain connected to the base or the gate of the first amplifier transistor, a base or a gate into which a control signal is input, and an emitter or a source that is grounded, and
a fifth transistor that has a collector or a drain connected to the base or the gate of the second amplifier transistor, a base or a gate connected to the base or the gate of the fourth transistor, and an emitter or a source that is grounded.

13. The power amplifier circuit according to claim 7, wherein the current control circuit comprises:
a first impedance circuit element that has a first end connected to the base or the gate of the first amplifier transistor and a second end;
a second impedance circuit element that has a first end connected to the base or the gate of the second amplifier transistor and a second end connected to the second end of the first impedance circuit element; and
a sixth transistor that has a collector or a drain connected to the second end of the first impedance circuit element and the second end of the second impedance circuit element, a base or a gate into which a control signal is input, and an emitter or a source that is grounded.

14. A Doherty amplifier circuit comprising:
a splitter configured to split a fifth signal into a sixth signal and a seventh signal, the seventh signal having a different phase than the sixth signal;
a carrier circuit comprising two or more carrier amplifiers, and configured to amplify the sixth signal, and to output a first amplified signal resulting from amplification of the sixth signal;
the power amplifier circuit according to claim 1, the power amplifier circuit being configured to amplify the seventh signal and to output an eighth signal resulting from amplification of the seventh signal;
a peak circuit comprising one or more peak amplifiers, and configured to amplify the eighth signal output from the power amplifier circuit, and to output a second amplified signal resulting from amplification of the eighth signal; and
a gain control circuit configured to control a gain of the power amplifier circuit based on a degree of saturation in the carrier amplifier closest to an output side in the carrier circuit.

15. A multistage amplifier circuit comprising:
the power amplifier circuit according to claim 1, the power amplifier circuit being configured to amplify an input signal and to output a signal resulting from amplification of the input signal;
an amplifier configured to amplify the input signal amplified by the power amplifier circuit; and
a gain control circuit configured to control a gain of the power amplifier circuit.

16. The multistage amplifier circuit according to claim 15, wherein the gain control circuit is configured to control the gain of the power amplifier circuit based on a degree of saturation in the amplifier.

* * * * *